United States Patent
Okuyama et al.

(10) Patent No.: US 7,250,320 B2
(45) Date of Patent: Jul. 31, 2007

(54) SEMICONDUCTOR LIGHT EMITTING ELEMENT, MANUFACTURING METHOD THEREOF, INTEGRATED SEMICONDUCTOR LIGHT EMITTING DEVICE, MANUFACTURING METHOD THEREOF, IMAGE DISPLAY DEVICE, MANUFACTURING METHOD THEREOF, ILLUMINATING DEVICE AND MANUFACTURING METHOD THEREOF

(75) Inventors: Hiroyuki Okuyama, Kanagawa (JP); Masato Doi, Kanagawa (JP); Goshi Biwa, Kanagawa (JP); Jun Suzuki, Kanagawa (JP); Toyoharu Oohata, Tokyo (JP)

(73) Assignee: Sony Corporation, Tokyo (JP)

( * ) Notice: Subject to any disclaimer, the term of this patent is extended or adjusted under 35 U.S.C. 154(b) by 281 days.

(21) Appl. No.: 10/512,131

(22) PCT Filed: Feb. 19, 2004

(86) PCT No.: PCT/JP2004/001952

§ 371 (c)(1),
(2), (4) Date: Oct. 21, 2004

(87) PCT Pub. No.: WO2004/084318

PCT Pub. Date: Sep. 30, 2004

(65) Prior Publication Data

US 2005/0145865 A1   Jul. 7, 2005

(30) Foreign Application Priority Data

Mar. 20, 2003   (JP)   ............................. 2003-077703

(51) Int. Cl.
*H01L 29/22*   (2006.01)
(52) U.S. Cl. ............................ 438/47; 438/44; 438/94; 438/116; 257/94; 257/95; 257/98; 257/E33.001

(58) Field of Classification Search .................. 438/47
See application file for complete search history.

(56) References Cited

U.S. PATENT DOCUMENTS 5,177,405 A   1/1993   Kusuda et al.

(Continued)

FOREIGN PATENT DOCUMENTS

JP   56-92577   7/1981

(Continued)

OTHER PUBLICATIONS

Tachibana, K. et al., "Selective growth of InGaN quantum dot structures and their microphotoluminescence at room temperature," Applied Physics Letters, May 29, 2000, vol. 76, No. 22, pp. 3212-3214.

(Continued)

*Primary Examiner*—Jerome Jackson
*Assistant Examiner*—José R. Diaz
(74) *Attorney, Agent, or Firm*—Bell, Boyd & Lloyd LLP

(57) ABSTRACT

A semiconductor light emitting element, manufacturing method thereof, integrated semiconductor light emitting device, manufacturing method thereof, illuminating device, and manufacturing method thereof are provided.

An n-type GaN layer is grown on a sapphire substrate, and a growth mask of SiN, for example, is formed thereon. On the n-type GaN layer exposed through an opening in the growth mask, a six-sided steeple-shaped n-type GaN layer is selectively grown, which has inclined crystal planes each composed of a plurality of crystal planes inclined from the major surface of the sapphire substrate by different angles of inclination to exhibit a convex plane as a whole. On the n-type GaN layer, an active layer and a p-type GaN layer are grown to make a light emitting element structure. Thereafter, a p-side electrode and an n-side electrode are formed.

27 Claims, 17 Drawing Sheets

U.S. PATENT DOCUMENTS

| | | | |
|---|---|---|---|
| 5,727,008 | A | 3/1998 | Koga |
| 5,732,098 | A | 3/1998 | Nisitani |
| 5,814,839 | A | 9/1998 | Hosoba |
| 5,828,088 | A | 10/1998 | Mauk |
| 5,981,977 | A | 11/1999 | Furukawa et al. |
| 6,252,255 | B1 | 6/2001 | Ueta et al. |
| 6,320,209 | B1 | 11/2001 | Hata et al. |
| 7,135,348 | B2 * | 11/2006 | Okuyama et al. ............ 438/47 |
| 2002/0117677 | A1 * | 8/2002 | Okuyama et al. ............ 257/94 |

FOREIGN PATENT DOCUMENTS

| | | |
|---|---|---|
| JP | 57-45583 | 3/1982 |
| JP | 57-52071 | 3/1982 |
| JP | 57-52072 | 3/1982 |
| JP | 57-52073 | 3/1982 |
| JP | 58-50577 | 3/1983 |
| JP | 61-156780 | 7/1986 |
| JP | 63-188938 | 8/1988 |
| JP | 2-263668 | 10/1990 |
| JP | 03-035568 | 2/1991 |
| JP | 06-045648 | 2/1994 |
| JP | 06-067044 | 3/1994 |
| JP | 07-199829 | 4/1995 |
| JP | 08-008217 | 1/1996 |
| JP | 08-255929 | 10/1996 |
| JP | 09-129974 | 5/1997 |
| JP | 09-199419 | 7/1997 |
| JP | 10-125929 | 5/1998 |
| JP | 10-265297 | 10/1998 |
| JP | 10-270801 | 10/1998 |
| JP | 10-312971 | 11/1998 |
| JP | 10-321910 | 12/1998 |
| JP | 11-026883 | 1/1999 |
| JP | 11-075019 | 3/1999 |
| JP | 11-177138 | 7/1999 |
| JP | 11-238687 | 8/1999 |
| JP | 11-251253 | 9/1999 |
| JP | 11-274568 | 10/1999 |
| JP | 11-312840 | 11/1999 |
| JP | 11-514136 | 11/1999 |
| JP | 11-346004 | 12/1999 |
| JP | 2000-012976 | 1/2000 |
| JP | 2000-068593 | 3/2000 |
| JP | 2000-150391 | 5/2000 |
| JP | 2000-183451 | 6/2000 |
| JP | 2000-223417 | 8/2000 |
| JP | 2000-332343 | 11/2000 |
| JP | 2001-085738 | 3/2001 |
| JP | 2001-217503 | 8/2001 |
| JP | 2002-100805 | 4/2002 |
| JP | 2002-261327 | 9/2002 |
| JP | 2002-185660 | 12/2002 |
| WO | WO 97/44612 | 11/1997 |
| WO | WO 02/07231 | 1/2002 |

OTHER PUBLICATIONS

Zheleva et al., "*Pendeo-epitaxy—a new approach for lateral growth of gallium nitride structures*," MRS Internet J. Nitride Semicond. Res. 4SI, G3.38 (1999).

Kapolnek et al., "*Spatial control of InGaN luminescence by MOCVD selective epitaxy*," Journal of Crystal Growth, 189/190 (1998) pp. 83-86.

Wang et al., "*Fabrication of nanoscale structures of InGaN by MOCVD lateral overgrowth*," Journal of Crystal Growth 197 (1999), pp. 48-53.

Singh et al., "*Selective Area Growth of GaN Directly on (0001) Sapphire by the HVPE Technique*," MRS Internet Journal Nitride Semiconductor Research, 3, 13 (1998), pp. 1-4.

Mao, et al., "*Defects in GaN Pyramids Grown on Si(111) Substrates by Selective Lateral Overgrowth*," Materials Research Society Meeting in Boston, Mass. (1998) pp. 1-6.

Yang et al., "*Single-crystal GaN pyramids grown on (111)Si substrates by selective lateral overgrowth*," Journal of Crystal Growth, vol. 204, No. 3, (1999), pp. 270-274.

Stringfellow et al., Journal of Crystal Growth, vol. 204, No. 3, (Jul. 11, 1999), pp. 247-418.

* cited by examiner

SEMICONDUCTOR LIGHT EMITTING ELEMENT, MANUFACTURING METHOD THEREOF, INTEGRATED SEMICONDUCTOR LIGHT EMITTING DEVICE, MANUFACTURING METHOD THEREOF, IMAGE DISPLAY DEVICE, MANUFACTURING METHOD THEREOF, ILLUMINATING DEVICE AND MANUFACTURING METHOD THEREOF

BACKGROUND OF THE INVENTION

This invention relates to a semiconductor light emitting element, manufacturing thereof, integrated semiconductor light emitting device, manufacturing method thereof, image display device, manufacturing method thereof, illuminating device and manufacturing method thereof, which are especially suitable for application to light emitting diodes using nitride III-V compound semiconductors.

A light emitting diode as a semiconductor light emitting element has been proposed. This semiconductor light emitting element was made by growing an n-type GaN layer on a sapphire substrate; next forming thereon a growth mask having a predetermined opening; selectively growing an n-type GaN layer in form of a six-sided pyramid having an inclined crystal plane inclined from the major surface of the substrate, i.e. having an S-oriented plane; and growing an active layer, p-type GaN layer and other layers on the inclined crystal plane (see, for example, brochure of International Publication No. 02/07231 (pages 47-50 and FIGS. 3-9)). This light emitting diode can prevent propagation of penetrating dislocations from the substrate side to layers composing the element structure, and can improve the crystalline property of these layers, high emission efficiency can be obtained.

FIGS. 1A and 1B show a typical semiconductor light emitting element disclosed in the above-mentioned literature. This semiconductor light emitting element is manufactured by the following method. An n-type GaN layer 102 is first grown on a sapphire substrate 101 having a C+ oriented major surface. After that, a SiO$_2$ film is formed on the entire surface of the n-type GaN layer 102, and it is patterned by lithography and etching to make a growth mask 104 having an opening of a predetermined geometry in a position for forming the element. The geometry of the opening 103 is a circle or a hexagon having one side parallel to the <11-20> direction. Size of the opening 103 is about 10 µm. In the next step, under the existence of the growth mask 104, an n-type GaN layer 105 is selectively grown on a part of the n-type GaN layer 102 exposed through the opening 103. As a result of the selective growth, the n-type GaN layer 105 is in form of a six-sided pyramid. Six planes of the six-sided pyramidal n-type GaN layer 106 are S-oriented planes inclined from the major surface of the sapphire substrate 101. After that, an active layer 106 composed of InGaN compounds, for example, and a p-type GaN layer 107 are sequentially grown on the n-type GaN layer 105. Through these steps, here is obtained a double-hetero-structured light emitting diode structure including the six-sided pyramidal n-type GaN layer 105, active layer 106 and p-type GaN layer 107, the last two being grown sequentially on the inclined crystal planes of the six-sided pyramidal n-type GaN layer 105. In the next step, which is not explained here in detail, a p-side electrode is formed on the p-type GaN layer 107 and an n-side electrode is formed on the n-type GaN layer.

Existing semiconductor light emitting elements, having a light emitting element structure made by selectively growing the six-sided pyramidal n-type GaN layer 105 having an S-oriented inclined crystalline plane and next growing the active layer 106 and the p-type GaN layer 107 on the S-oriented plane, were unsatisfactory in light emitting efficiency, and inevitably required a large occupied area per each element.

SUMMARY OF THE INVENTION

The present invention in an embodiment provides a semiconductor light emitting element sufficiently high in light emitting efficiency and small in occupied area per each element, as well as a manufacturing method of the semiconductor light emitting element.

The present invention in another embodiment provides an integrated semiconductor light emitting device sufficiently high in light emitting efficiency and small in occupied area per each element, a manufacturing method thereof, an image display device, a manufacturing method thereof, an illuminating device and a manufacturing method thereof.

In an embodiment of the invention is a semiconductor light emitting element comprising:

a semiconductor layer of a first conduction type which is formed on a major surface and includes a convex crystal portion having an inclined crystal plane composed of a plurality of crystal planes inclined from the major surface by different angles of inclination to exhibit a convex plane as a whole;

at least an active layer and a semiconductor layer of a second conduction type which are sequentially layered at least on the inclined crystal plane of the crystal portion;

a first electrode electrically connected to the semiconductor layer of the first conduction type; and a second electrode formed on the semiconductor layer of the second conduction type on the crystal portion and electrically connected to the semiconductor layer of the second conduction type.

Materials of the semiconductor layer of the first conduction type, active layer and semiconductor layer of the second conduction type can include any suitable material. However, materials having a wurtzite crystalline structure are typically used. Examples of semiconductors having a wurtzite crystalline structure are nitride III-V compound semiconductors. In addition, II-VI compound semiconductors such as BeMgZnCdS compound semiconductors and BeMgZnCdO compound semiconductors can be given as such examples. Most widely, nitride III-V compound semiconductors are composed of $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+1 < 1$ and $0 \leq u+v < 1$). More specific examples are composed of $Al_xB_yGa_{1-x-y-z}In_zN$ (where $0 \leq x \leq 1$, $0 \leq y \leq 1$, $0 \leq z \leq 1$ and $0 \leq x+y+1 < 1$). Typical examples are composed of $Al_xGa_{1-x-z}In_zN$ (where $0 \leq x \leq 1$ and $0 \leq z \leq 1$). Examples of nitride III-V compound semiconductors include GaN, InN, AlN, AlGaN, InGaN, AlGaInN, and the like.

In case the semiconductor layer of the first conduction type has a wurtzite crystalline structure, the plurality of crystal planes as constituents of the inclined crystal plane of the convex crystal portion of the semiconductor layer are typically S-oriented planes (including planes that can be regarded S-oriented planes substantially). Angles of inclination of the crystal planes as constituents of the inclined crystal planes become smaller from the bottom of the crystal portion toward the apex. This crystal portion typically has a steeple-shaped configuration, which is six-sided most typically. In this case, angles of inclination of the uppermost crystal planes of the crystal portion, i.e. the upper parts of the crystal planes involving the apex of the crystal portion, which compose the inclined crystal planes, are preferably in the range from about 3 µm to about 20 µm, or typically in the range from about 10 µm to about 15 µm.

In another embodiment, the present invention includes a method of manufacturing a semiconductor light emitting element having: a semiconductor layer of a first conduction type which is formed on a major surface and includes a convex crystal portion having an inclined crystal plane composed of a plurality of crystal planes inclined from the major surface by different angles of inclination to exhibit a convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having an opening at a predetermined position on the first semiconductor layer;

selectively growing a second semiconductor layer of the first conduction type on the first semiconductor layer exposed through the opening in the growth mask; and sequentially growing at least the active layer and the semiconductor layer of the second conduction type to cover the second semiconductor layer.

In an embodiment, the entirety of the first semiconductor layer of the first conduction type and the second semiconductor layer of the first conduction type corresponds to the semiconductor layer of the first conduction type.

In general, any material may be used as the substrate provided it assures a good crystallographic property when the first semiconductor layer of the first conduction type, second semiconductor layer of the first conduction type, active layer, semiconductor layer of the second conduction type, and so forth, are grown thereon. More specifically, here is usable a substrate made of sapphire ($Al_2O_3$) (including C-oriented plane, A-oriented plane and R-oriented plane), SiC (including 6H, 4H and 3C), nitride III-V compound semiconductors (such as GaN, InAlGaN, AlN, and the like), Si, ZnS, ZnO, LiMgO, GaAs, $MgAl_2O_4$ or the like. Preferably, a hexagonal crystalline substrate or a cubic crystalline substrate of one of those materials is used, but a hexagonal crystalline substrate is more preferable. In case the first semiconductor layer of the first conduction type, second semiconductor layer of the first conduction type, active layer and semiconductor layer of the second conduction type are made of nitride III-V compound semiconductors, a sapphire substrate having a C-oriented plane as its major surface may be used. The term "C-oriented plane" or the like herein includes any crystalline plane that slightly inclines therefrom up to about 5 to about 6° and can be regarded as the C-oriented plane substantially.

For growth of the first semiconductor layer of the first conduction type, second semiconductor layer of the first conduction type, active layer and semiconductor layer of the second conduction type, metal organic chemical vapor deposition (MOCVD), hydride vapor phase epitaxy or halide vapor phase epitaxy (HVPE), for example, may be used. To ensure that the inclined crystal plane of the convex crystal portion makes a good convex plane composed of a plurality of crystal planes different in angle of inclination, growth temperature for selective growth of the second semiconductor layer of the first conduction type among those layers is controlled preferably within the range from about 920° C. to about 960° C., more preferably within the range from about 920° C. to about 950° C., or still more preferably around about 940° C. Growth rate for the selective growth is controlled preferably at or above 6 µm/h, or more preferably in the range from about 6 µm/h to about 18 µm/h. For growth of the active layer and the semiconductor layer of the second conduction type, growth temperatures are typically controlled lower by about 20° C. to about 40° C. or more, for example, than the growth temperature of the second semiconductor layer of the first conduction type.

Basically, the growth mask may be made of any material provided nucleation on the growth mask is amply less than nucleation on the first semiconductor layer (in other words, growth on the growth mask is prevented), and selective growth is therefore assured. Typically, however, a silicon oxide nitride (SiON) film, silicon nitride (SiN (especially $Si_3N_4$) film or their lamination is used as the growth mask. Otherwise, the growth mask may be an aluminum oxide ($Al_2O_3$) film, tungsten (W) film and a laminated film combining any of these films and any of the above-mentioned films. To assure that the second semiconductor layer becomes a good steeple-shaped or pyramidal configuration, especially six-sided, the growth mask is preferably a mask at least with its top surface being made of silicon nitride, such as a mask made of a silicon nitride film or a mask made by stacking a silicon nitride film on a silicon oxide film.

The opening of the growth mask may have any geometry. Typically, however, it is hexagonal or circular. In case the opening of the growth mask is hexagonal, at lest one side of the hexagon is preferably normal to the <1-100> direction or <11-20> direction to prevent that the semiconductor layer grown by using the growth mask deviates from the hexagon.

Size of the opening in the growth mask (maximum measure in the direction parallel to the major surface of the substrate) is preferably small to reduce the area occupied by the element. However, if it is excessively small, it tends to invite crystal defects such as dislocations, depositional defects or the like during selective growth of the second semiconductor layer. Taking these factors into consideration, size of the opening in the growth is roughly in the range from about ¼ to about 1 time the size of the semiconductor light emitting element. For example, it is in the range from about 2 µm to about 13 µm. If a slightly smaller size is preferable, the size of the opening is typically in the range from about 2 µm to about 5 µm or more preferably in the range from about 2.5 µm to about 3.5 µm. If a slightly larger size is preferable, the size of the opening is typically in the range about 7 µm to about 13 µm or more preferably in the range from about 9 µm to about 11 µm.

Typically, the second semiconductor layer is selectively grown to spread horizontally wider than the opening of the growth mask. However, this is not an indispensable requirement, but the second semiconductor layer may be grown within the limit of the opening.

Typically, the second semiconductor layer is selectively grown so that a steeple-like configuration is formed. However, after the second semiconductor layer is selectively grown such that a crystal plane substantially parallel to the substrate is formed on its top portion, an undoped semiconductor layer may be grown on the top portion. Thereby, in case the second electrode is formed on the semiconductor layer of the second conduction type whereas the first electrode is formed on the semiconductor layer of the first conduction type comprising the first semiconductor layer and the second semiconductor layer and a current is supplied between the first electrode and the second electrode, the undoped semiconductor layer grown to form the apex portion of the steeple-shaped crystal portion functions as a current blocking portion to prevent the current from flowing thereto. Since the crystalline quality of the apex portion of the crystal portion is usually inferior to the other portion, this structure enables the current to flow bypassing the apex portion of the crystal portion assures that the current flows only through the other portion having a good crystalline quality, and contributes to enhancing the emission efficiency.

The growth mask is usually left also after completion of the selective growth. However, it may be removed after the selective growth. In this case, a step of removing the growth mask intervenes between the step of selectively growing the second semiconductor layer of the first conduction type on the first semiconductor layer in the opening of the growth mask and the step of sequentially growing at least the active layer and the semiconductor layer of the second conduction type to cover the second semiconductor layer.

In an embodiment, the present invention provides is an integrated semiconductor light emitting device including a plurality of integrated semiconductor light emitting elements each comprising:

a semiconductor layer of a first conduction type which is formed on a major surface and includes a convex crystal portion having an inclined crystal plane composed of a plurality of crystal planes inclined from the major surface by different angles of inclination to exhibit a convex plane as a whole;

at least an active layer and a semiconductor layer of a second conduction type which are sequentially layered at least on the inclined crystal plane of the crystal portion;

a first electrode electrically connected to the semiconductor layer of the first conduction type; and a second electrode formed on the semiconductor layer of the second conduction type on the crystal portion and electrically connected to the semiconductor layer of the second conduction type.

To assure that the inclined crystal plane of each convex crystal portion exhibits a good convex plane composed of a plurality of crystal planes different in angle of inclination, size of each opening of the growth mask is preferably in the range from about ¼ to about 1 time the size of each semiconductor light emitting element, in general. More specifically, it is in the range from about 2 µm to about 13 µm. If a slightly smaller size is desirable, it is typically in the range from about 2 µm to about 5 µm, or preferably in the range from about 2.5 µm to about 3.5 µm. If a slightly larger size is desirable, it is typically in the range from about 7 µm to about 13 µm, or preferably in the range from about 9 µm to about 11 µm. Distance between openings of the growth mask is generally a double or more of the size of each semiconductor light emitting element. More specifically, it is about 10 µm or more, preferably about 13 µm or more, or typically in the range from about 13 µm to about 30 µm.

The integrated semiconductor light emitting device can be used for any purpose. Its typical applications will be image display devices and illuminating devices, for example. The integrated semiconductor light emitting device contemplates both a device including a plurality of semiconductor light emitting elements monolithically formed on a common substrate and a device including a plurality of semiconductor light emitting elements that are first monolithically formed on a common substrate, then divided to discrete elements and then mounted on another substrate.

In yet another embodiment, the present invention provides a method of manufacturing an integrated semiconductor light emitting device integrating a plurality of integrated light emitting elements each having a semiconductor layer of a first conduction type which is formed on a major surface and includes a convex crystal portion having an inclined crystal plane composed of a plurality of crystal planes inclined from the major surface by different angles of inclination to exhibit a convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having openings at predetermined positions on the first semiconductor layer;

selectively growing a second semiconductor layer of the first conduction type on the first semiconductor layer exposed through the openings in the growth mask; and sequentially growing at least the active layer and the semiconductor layer of the second conduction type to cover the second semiconductor layer.

In still yet another embodiment, the present invention provides an image display device including a plurality of semiconductor light emitting elements each comprising:

a semiconductor layer of a first conduction type which is formed on a major surface and includes a convex crystal portion having an inclined crystal plane composed of a plurality of crystal planes inclined from the major surface by different angles of inclination to exhibit a convex plane as a whole;

at least an active layer and a semiconductor layer of a second conduction type which are sequentially layered at least on the inclined crystal plane of the crystal portion;

a first electrode electrically connected to the semiconductor layer of the first conduction type; and a second electrode formed on the semiconductor layer of the second conduction type on the crystal portion and electrically connected to the semiconductor layer of the second conduction type.

In a further embodiment, the present invention provides a method of manufacturing an image display device integrating a plurality of integrated light emitting elements each having a semiconductor layer of a first conduction type which is formed on a major surface and includes a convex crystal portion having an inclined crystal plane composed of a plurality of crystal planes inclined from the major surface by different angles of inclination to exhibit a convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having openings at predetermined positions on the first semiconductor layer;

selectively growing a second semiconductor layer of the first conduction type on the first semiconductor layer exposed through the openings in the growth mask; and sequentially growing at least the active layer and the semiconductor layer of the second conduction type to cover the second semiconductor layer.

In still a further embodiment, the present invention provides an illuminating device having a single semiconductor light emitting element or a plurality of integrated semiconductor light emitting elements each comprising:

a semiconductor layer of a first conduction type which is formed on a major surface and includes a convex crystal portion having an inclined crystal plane composed of a plurality of crystal planes inclined from the major surface by different angles of inclination to exhibit a convex plane as a whole;

at least an active layer and a semiconductor layer of a second conduction type which are sequentially layered at least on the inclined crystal plane of the crystal portion;

a first electrode electrically connected to the semiconductor layer of the first conduction type; and a second electrode formed on the semiconductor layer of the second conduction type on the crystal portion and electrically connected to the semiconductor layer of the second conduction type.

In another embodiment, the present invention provides a method of manufacturing an illuminating device having a single semiconductor light emitting element or a plurality of integrated semiconductor light emitting elements each including: a semiconductor layer of a first conduction type which is formed on a major surface and includes a convex crystal portion having an inclined crystal plane composed of a plurality of crystal planes inclined from the major surface by different angles of inclination to exhibit a convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having an opening at a predetermined position on the first semiconductor layer;

selectively growing a second semiconductor layer of the first conduction type on the first semiconductor layer exposed through the opening in the growth mask; and sequentially growing at least the active layer and the semiconductor layer of the second conduction type to cover the second semiconductor layer.

In an embodiment, the present invention provides a semiconductor light emitting element comprising:

a semiconductor layer of a first conduction type which is formed on a major surface and includes a convex crystal portion having an inclined crystal plane exhibiting a substantially convex plane as a whole;

at least an active layer and a semiconductor layer of a second conduction type which are sequentially layered at least on the inclined crystal plane of the crystal portion;

a first electrode electrically connected to the semiconductor layer of the first conduction type; and a second electrode formed on the semiconductor layer of the second conduction type on the crystal portion and electrically connected to the semiconductor layer of the second conduction type.

In an embodiment, the present invention provides a method of manufacturing a semiconductor light emitting element having: a semiconductor layer of a first conduction type which is formed on a major surface and includes a convex crystal portion having an inclined crystal plane exhibiting a substantially convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having an opening at a predetermined position on the first semiconductor layer;

selectively growing a second semiconductor layer of the first conduction type on the first semiconductor layer exposed through the opening in the growth mask; and sequentially growing at least the active layer and the semiconductor layer of the second conduction type to cover the second semiconductor layer.

In an embodiment, the present invention provides an integrated semiconductor light emitting device including a plurality of integrated semiconductor light emitting elements each comprising:

a semiconductor layer of a first conduction type which is formed on a major surface and includes a convex crystal portion having an inclined crystal plane exhibiting a substantially convex plane as a whole;

at least an active layer and a semiconductor layer of a second conduction type which are sequentially layered at least on the inclined crystal plane of the crystal portion;

a first electrode electrically connected to the semiconductor layer of the first conduction type; and a second electrode formed on the semiconductor layer of the second conduction type on the crystal portion and electrically connected to the semiconductor layer of the second conduction type.

In a further embodiment, the present invention provides a method of manufacturing an integrated semiconductor light emitting device including a plurality of integrated semiconductor light emitting elements each having: a semiconductor layer of a first conduction type which is formed on a major surface and includes a convex crystal portion having an inclined crystal plane exhibiting a substantially convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having openings at predetermined positions on the first semiconductor layer;

selectively growing a second semiconductor layer of the first conduction type on the first semiconductor layer exposed through the openings in the growth mask; and sequentially growing at least the active layer and the semiconductor layer of the second conduction type to cover the second semiconductor layer.

In an embodiment, an image display device is provided including a plurality of semiconductor light emitting elements each comprising:

a semiconductor layer of a first conduction type which is formed on a major surface and includes a convex crystal portion having an inclined crystal plane exhibiting a substantially convex plane as a whole;

at least an active layer and a semiconductor layer of a second conduction type which are sequentially layered at least on the inclined crystal plane of the crystal portion;

a first electrode electrically connected to the semiconductor layer of the first conduction type; and a second electrode formed on the semiconductor layer of the second conduction type on the crystal portion and electrically connected to the semiconductor layer of the second conduction type.

In an embodiment, the present invention provides a method of manufacturing an image display device integrating a plurality of integrated light emitting elements each having a semiconductor layer of a first conduction type which is formed on a major surface and includes a convex crystal portion having an inclined crystal plane exhibiting a substantially convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having openings at predetermined positions on the first semiconductor layer;

selectively growing a second semiconductor layer of the first conduction type on the first semiconductor layer exposed through the openings in the growth mask; and sequentially growing at least the active layer and the semiconductor layer of the second conduction type to cover the second semiconductor layer.

In an embodiment, the present invention provides an illuminating device having a single semiconductor light emitting element or a plurality of integrated semiconductor light emitting elements each comprising:

a semiconductor layer of a first conduction type which is formed on a major surface and includes a convex crystal portion having an inclined crystal plane exhibiting a substantially convex plane as a whole;

at least an active layer and a semiconductor layer of a second conduction type which are sequentially layered at least on the inclined crystal plane of the crystal portion;

a first electrode electrically connected to the semiconductor layer of the first conduction type; and a second electrode formed on the semiconductor layer of the second conduction type on the crystal portion and electrically connected to the semiconductor layer of the second conduction type.

In an embodiment, the present invention provides a method of manufacturing an illuminating device having a single semiconductor light emitting element or a plurality of integrated semiconductor light emitting elements each including: a semiconductor layer of a first conduction type which is formed on a major surface and includes a convex crystal portion having an inclined crystal plane exhibiting a substantially convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having an opening at a predetermined position on the first semiconductor layer;

selectively growing a second semiconductor layer of the first conduction type on the first semiconductor layer exposed through the opening in the growth mask; and sequentially growing at least the active layer and the semiconductor layer of the second conduction type to cover the second semiconductor layer.

In an embodiment, each inclined crystal plane forming a substantially convex plane as a whole may locally include a flat plane.

According to the invention having the above-summarized configuration, the semiconductor layer of the first conduction type is selectively grown under the existence of the growth mask having the opening in a predetermined portion. Thereby, it is possible to make a convex crystal portion having an inclined crystal plane composed of a plurality of crystal planes different in angle of inclination to exhibit a good convex plane as a whole or having an inclined crystal exhibiting a substantially convex plane as a whole. Then, by sequentially growing at least the active layer and the semiconductor layer of the second conduction type to cover the crystal plane, the light emitting element structure can be formed. In this case, the semiconductor layer of the second conduction type also has an inclined crystal plane composed of a plurality of crystal planes different in angle of inclination to exhibit a good convex plane as a whole, or an inclined crystal plane exhibiting a substantially convex plane as a whole. Therefore, in operation of the element, light generated from the active layer can be extracted efficiently by reflection at the inclined crystal plane of the semiconductor layer of the second conduction type, which exhibits the convex plane or the substantially convex plane. Moreover, in comparison with a structure in which the crystal portion has an S-oriented inclined crystal plane, the present invention can diminish the size of the crystal portion and can therefore reduce the size of the light emitting element structure made by sequentially growing the active layer and the semiconductor layer of the second conduction type on the crystal portion. Furthermore, since the light extracting direction can be closer to the direction normal to the major plane, light is less subjected to blockage even when a black mask, or the like, is placed in the portion other than the light emitting portion.

Additional features and advantages of the present invention are described in, and will be apparent from, the following Detailed Description of the Invention and the figures.

DETAILED DESCRIPTION OF THE INVENTION

Figure 1A:
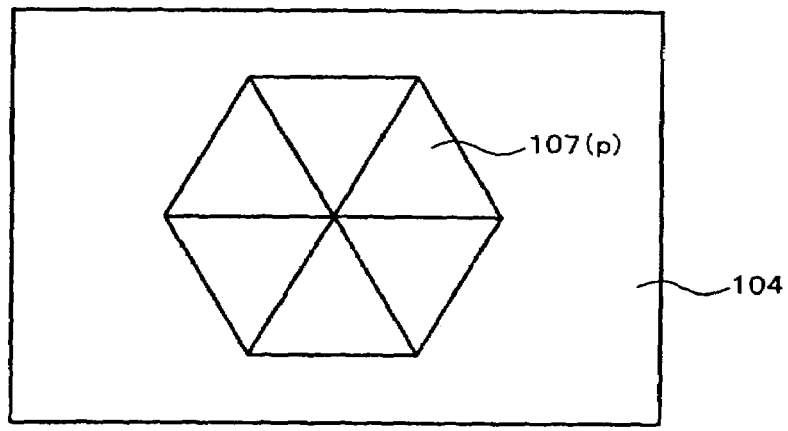
FIGS. 1A and 1B are a plan view and a cross-sectional view of a conventional GaN-based light emitting diode.

This invention relates to a semiconductor light emitting element, manufacturing thereof, integrated semiconductor light emitting device, manufacturing method thereof, image display device, manufacturing method thereof, illuminating device and manufacturing method thereof, which are especially suitable for application to light emitting diodes using nitride III-V compound semiconductors.

Embodiments of the invention are explained below with reference to the drawings. In all figures showing embodiments of the invention, common or equivalent components are labeled common reference numerals.

FIGS. 2A and 2B through FIGS. 5A and 5B show a manufacturing method of a GaN-based light emitting diode according to the first embodiment of the invention, in which the figures numbered with the suffix A are plan views whereas the figures numbered with the suffix B are cross-sectional views.

Figure 2A:
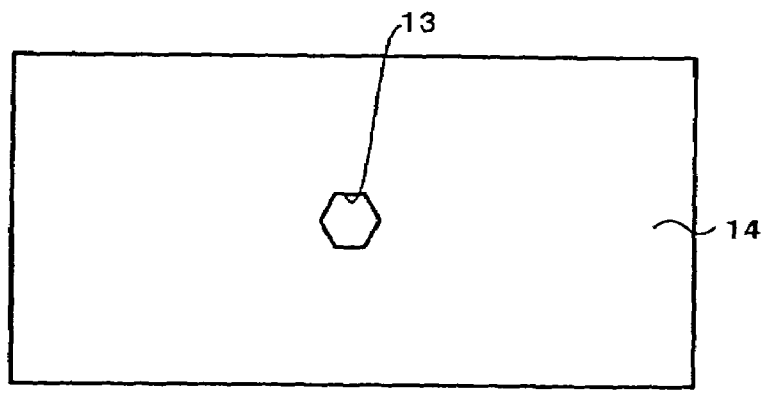
FIGS. 2A and 2B are a plan view and a cross-sectional view for explaining a manufacturing method of a GaN-based light emitting diode according to an embodiment of the invention.
Figure 2B:
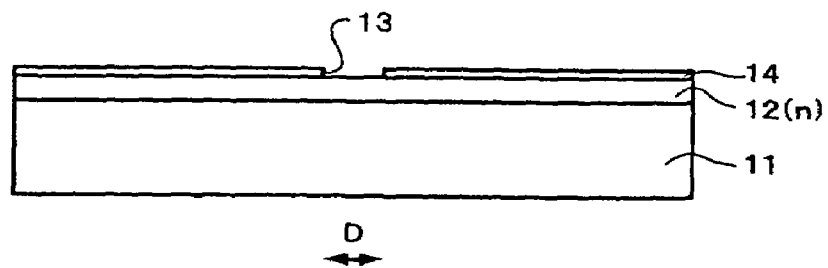

In the first embodiment, first referring to FIGS. 2A and 2B, a sapphire substrate 11 having a C+ oriented major surface, for example, is prepared. After the surface of the sapphire substrate 11 is cleaned by thermal cleaning, for example, an n-type GaN layer 12 doped with an n-type impurity such as Si is grown on the sapphire substrate 11 by metal organic chemical vapor deposition (MOCVD), for example. The n-type GaN layer 12 is desirably minimized in crystal defects and penetrating dislocations, and a thickness around 2 μm will be enough in most cases. Various techniques are employable for forming a defects-reduced n-type GaN layer 12. A typical technique first grows a GaN buffer layer or an AlN buffer layer (not shown) on the sapphire substrate 11 at a low temperature around 500° C., then raises the temperature to approximately 1000° C. to crystallize it, and grows the n-type GaN layer 12 thereon. This technique may be modified to grow an undoped GaN layer after the growth of the GaN buffer layer or the AlN buffer layer and to thereafter grow the n-type GaN layer 12.

Figure 6:
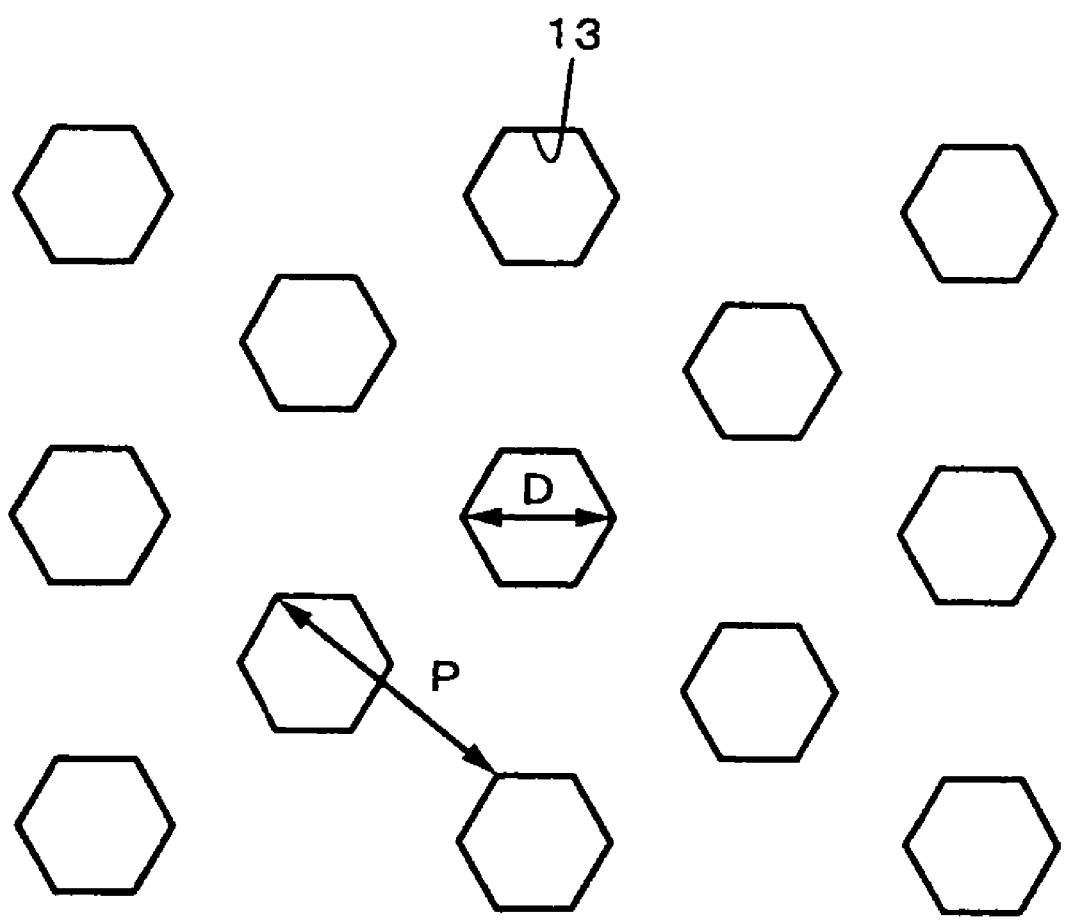
FIG. 6 is a plan view showing an array of openings formed in a mask in the manufacturing method of the GaN-based light emitting diode according to an embodiment of the invention.

In the next step, a $SiO_2$ film, approximately 200 nm, for example, and a SiN film (especially, $Si_3N_4$ film), approximately 10 nm thick, are formed sequentially on the entire surface of the n-type GaN layer 12 by CVD, vacuum evaporation, sputtering, or the like, or preferably by plasma CVD. After that, a resist pattern (not shown) of a predetermined geometry is formed thereon by lithography. Then, under the existence of this resist pattern as a mask, the SiN film and the $SiO_2$ film are etched and patterned to a growth mask 14 having openings 13 at positions for forming elements by wet etching using a fluoric acid-based etchant, for example, or by RIE using an etching gas containing fluorine, such as $CF_4$, $CFH_3$, or the like. Each opening has the shape of a hexagon having one side normal to the <1-100> or <11-20> orientation. Size D of the openings is determined to meet the requirement. Usually, it is 2 to 13 μm. In this embodiment, it may be 3 μm, for example. FIGS. 2A and 2B illustrate only one opening 13. Actually, however, a plurality of openings are formed in an array. FIG. 6 shows an exemplary layout of the openings 13. In FIG. 6, P denotes the pitch of the openings. The pitch P is 10 μm or more in most cases. In this embodiment, it may be 14 μm, for example.

Figure 3A:
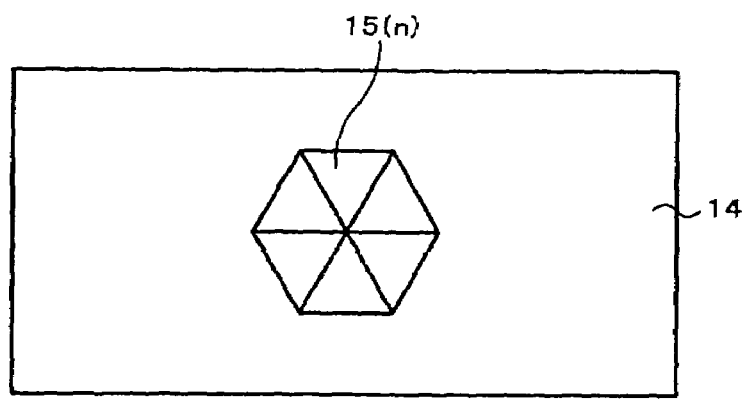
FIGS. 3A and 3B are a plan view and a cross-sectional view for explaining the manufacturing method of the GaN-based light emitting diode according to an embodiment of the invention.
Figure 3B:
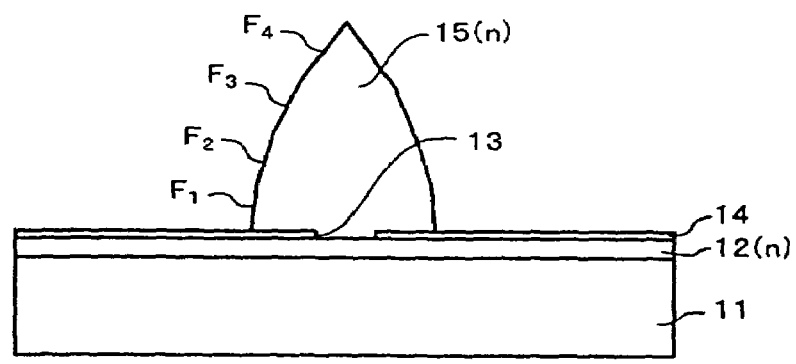

In the next step, as shown in FIGS. 3A and 3B, the n-type GaN layer 15, doped with an n-type impurity such as Si, is selectively grown on the n-type GaN layer 12 exposed through the openings 13 in the growth mask 14. Growth temperature in this process may be 940° C. Growth rate is set very high, for example, as high as 11.0 to 11.3 μm/h, in planar growth reduction. In the process of this selective growth, the growth rate may be lowered by lowering the growth temperature than 940° C. to render the growth slower near the interface with the n-type GaN layer 12. However, for the growth of the most part excluding the proximity to the interface with the n-type GaN layer 12, the growth temperature is set to 940° C., and the growth rate is raised to the high rate of 11.0 to 11.3 μm/h in planar growth reduction. As a result of this selective growth, the six-sided steeple-shaped n-type GaN layer 15 is obtained. Each of the six planes of the steeple-shaped n-type GaN layer 15 is composed of a plurality of (typically, a lot of, or innumerable) crystal planes inclined from the major surface of the sapphire substrate 11 by different angles of inclination from each other. However, assume here that each of the six planes is composed of four crystal planes $F_1$, $F_2$, $F_3$ and $F_4$ and they make a convex inclined crystal plane as a whole. In this case, angles of inclination of the crystal planes $F_1$, $F_2$, $F_3$ and $F_4$ become smaller from the bottom of the n-type GaN layer 15 toward its apex. Angle of inclination of the crystal plane $F_4$ of the upper most portion including the apex is, for example, 62° to 63° whereas angle of inclination of the crystal plane $F_1$ of the lowermost portion including the bottom is, for example, 74° to 82°. All of the crystal planes composing the generally convex inclined crystal plane can be regarded as S-oriented planes or substantially S-oriented planes. Accordingly, the n-type GaN layer 15 is a combination of a plurality of single crystals slightly different in crystalline orientation from each other. Size of the n-type GaN layer 15 may be determined depending upon the requirement. In this case, however, it is larger than the size of the opening 13. More specifically, it is approximately three times the size of the opening 15.

Subsequently to the growth of the n-type GaN layer 15 as explained above, as shown in FIGS. 4A and 4B, an active layer 16 of InGaN compounds, for example, and a p-type GaN layer 17 doped with a p-type impurity such as Mg are sequentially grown on the sapphire substrate 11. As a result, the six-sided steeple-shaped n-type GaN layer 15 as well as the active layer 16 and the p-type GaN layer 17 grown on the inclined crystal planes of the n-type GaN layer 15 make a light emitting diode structure having double hetero structure. After that, Mg in the p-type GaN layer 17 is activated by annealing in a nitrogen atmosphere controlled at a temperature around 850° C. Thickness of the active layer and the p-type GaN layer 17 is determined depending upon the requirement. However, thickness of the active layer 16 is preferably 3 nm for example (thickness of the active layer 16 after growth usually has some small measure of distribution from the top to the bottom). Thickness of the p-type GaN layer 17 is preferably as thin as possible within the extent adversely affecting the emission property. For example, it may be 0.2 μm. If it is 0.05 μm, the operation voltage can be reduced to 3 V or less. Growth temperatures of these GaN-based semiconductor layers are controlled in the range of 650 to 800° C., more specifically at 740° C. for example, in case of the active layer 16. In case of the p-type GaN layer 17, growth temperature is set to a rather high temperature within the extent not adversely affecting the property of the active layer 16, namely in the range of 880 to 940° C., and more specifically at 900° C., for example. The active layer 16 may be composed of either a single layer of InGaN, for example, or a multi-quantum well structure alternately stacking two InGaN layers different in In composition, for example. The In composition is determined depending upon the intended emission wavelength. In the p-type GaN layer 17, Mg concentration of its uppermost layer is preferably increased to assure good ohmic contact with a p-side electrode, explained later. Alternatively, a p-type InGaN layer doped with Mg as a p-type impurity, for example, and easy to make ohmic contact may be grown on the p-type GaN layer 17, and the p-side electrode may formed thereon.

Figure 4A:
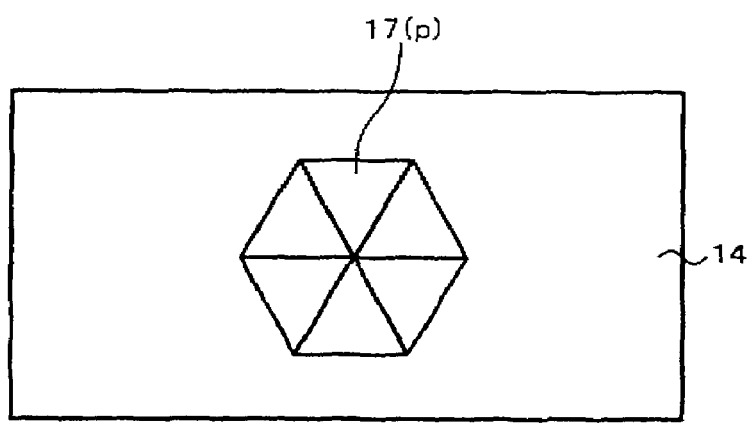
FIGS. 4A and 4B are a plan view and a cross-sectional view for explaining the manufacturing method of the GaN-based light emitting diode according to an embodiment of the invention.
Figure 4B:
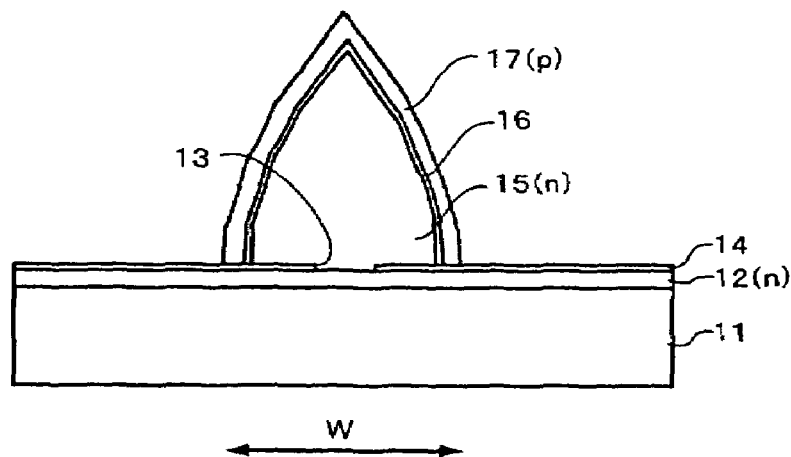
Figure 5A:
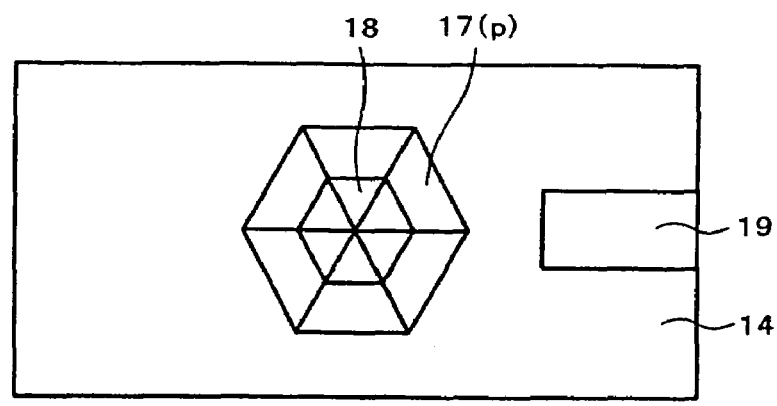
FIGS. 5A and 5B are a plan view and a cross-sectional view for explaining the manufacturing method of the GaN-based light emitting diode according to an embodiment of the invention.
Figure 5B:
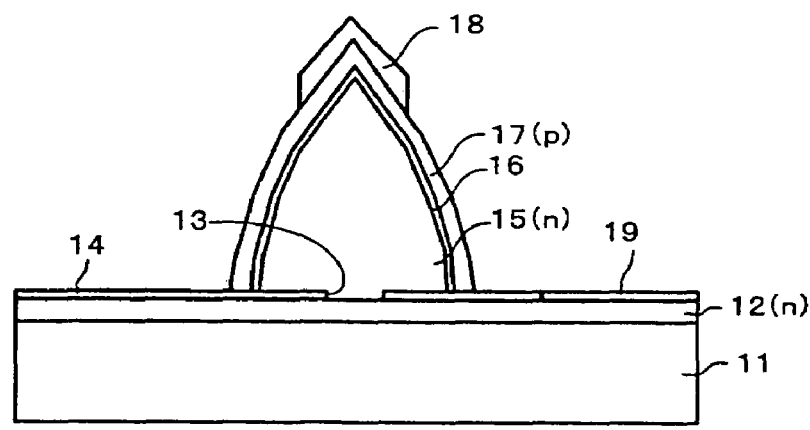

Size W of the light emitting structure is approximately 10 μm for example (see FIG. 4B).

With regard to source materials for growth of the above-explained GaN-based semiconductor layers, here are used, for example, trimethylgallium (($CH_3)_3$Ga, TMG) as the source material of Ga, trimethylaluminum (($CH_3)_3$Al, TMA) as the source material of Al, trimethylindium (($CH_3)_3$In, TMI) as the source material of In and $NH_3$ as the source material of N. Concerning the dopants, here are used silane ($SiH_4$) as the n-type dopant, and bis(methyl cyclopentadienile)-magnesium (($CH_3C_5H_4)_2$Mg) or bis(cyclopentadienile)-magnesium (($C_5H_5)_2$Mg) as the p-type dopant.

Regarding the carrier gas atmosphere during growth of the GaN-based semiconductor layers, a mixed gas of $N_2$ and $H_2$ is used for the n-type GaN layer 12 and the n-type GaN layer 15. For growth of the active layer 16, a $N_2$ gas atmosphere is used as the carrier gas atmosphere. For growth of the p-type GaN layer 17, a mixed gas of $N_2$ and $H_2$ is used. In this case, since the $N_2$ gas is used as the carrier gas atmosphere during growth of the active layer 16 and the carrier gas atmosphere does not contain $H_2$, it is possible to prevent elimination of In and deterioration of the active layer 16 thereby. Moreover, since the mixed gas atmosphere of $N_2$ and $H_2$ is used as the carrier gas atmosphere for growth of the p-type GaN layer 17, the p-type layer can be grown with a good crystallographic quality.

After that, the sapphire substrate 11 having GaN-based semiconductor layers grown thereon is removed from the MOCVD apparatus.

In the next step, a Ni film, Ag film (or Pt film) and Au film are sequentially deposited on the entire substrate surface by vacuum evaporation, for example. After that, a resist pattern of a predetermined geometry is formed on them by lithography. Under the existence of the resist pattern as a mask, the Ni film, Ag film and Au film are etched. As a result, a Ni/Ag (or Pt)/Au structured p-side electrode 18 is formed in the region including the apex of the active layer 16 and the p-type GaN layer 17 grown on the six-sided steeple-shaped n-type GaN layer 15. Size of the p-side electrode 18 is determined to minimize the flow of the drive current in the defective region in the n-type GaN layer 15 and others. More specifically, it may be approximately 4 μm.

In the next step, the growth mask 14 is selectively removed by etching to expose the n-type GaN layer 12. Thereafter, a Ti film, Pt film and Au film are sequentially deposited on the entire substrate surface by vacuum evaporation, and a resist pattern of a predetermined geometry is formed thereon by lithography. Thereafter, under the existence of the resist pattern as a mask, the Ti film, Pt film and Au film are etched. As a result, a Ti/Pt/Au structured n-side electrode 19 if formed in contact with the n-type GaN layer 12.

After that, the substrate having an array of light emitting diode structures thereon is divided to chips by etching or exfoliation with a dicer or excimer laser to obtain the intended GaN-based light emitting diode. The substrate may undergo an additional process of approximately leveling its surface before the substrate having the array of light emitting diode structures is divided to chips.

The GaN-based light emitting diode, thus obtained, was driven for trial by supplying a current between the p-side electrode 18 and the n-side electrode 19. As a result, emission through the sapphire substrate 11 was confirmed at an emission wavelength in the range from 380 to 620 nm, for example, at the emission wavelength of 450 nm, depending upon the In composition of the active layer. Emission efficiency was high, and the emission output was 40 µW under the drive current of 200 µA, for example.

Here is explained the angle of inclination of the crystal plane $F_1$ among the plurality of crystal planes composing each convex inclined crystal plane of the six-sided steeple-shaped n-type GaN layer 15 in relation to the emission efficiency. As already explained, the angle of inclination of the crystal plane $F_1$ is 74° to 82°, for example. Emission efficiency tends to become better as the angle of inclination increases. For example, in case the angle of inclination is 74°, when the growth thickness of the n-type GaN layer 15 is 2 µm in planar growth reduction, under the size D of the opening 13 being D=10 µm and the pitch P being 29 µm, emission efficiency was 100 m/W/A. In case of 76°, when the growth thickness of the n-type GaN layer 15 is 2 µm in planar growth reduction, under the size D of the opening 13 being D=3 µm and the pitch P is P=17 µm, the emission efficiency was 200 mW/A. In case of 82°, when the growth thickness of the n-type GaN layer 15 is 4 µm in planar growth reduction, under the size D of the opening 13 being D=3 µm and the pitch P is P=17 µm, the emission efficiency was 210 mW/A.

Next explained is the size D and the pitch P of the openings 13 in the growth mask 14 shown in FIG. 6 in relation to the emission efficiency. Many samples with combinations (D, P) (in µm) were prepared while changing D in the range from 3 to 10 µm and P in the range from 11~28 µm, and the n-type GaN layer 15 was selectively grown on individual samples. As a result, there was the tendency that the larger the pitch P, the better the inclined crystal planes of the steeple-shaped n-type GaN layer 15 and the higher the emission efficiency. Regarding the size D, there was the tendency that the smaller the size D the higher the emission efficiency. Additionally, it was observed how the light was extracted, and much light appeared to emit from the entirety, not only from the central portion of the element but also from the side surfaces.

Figure 7:
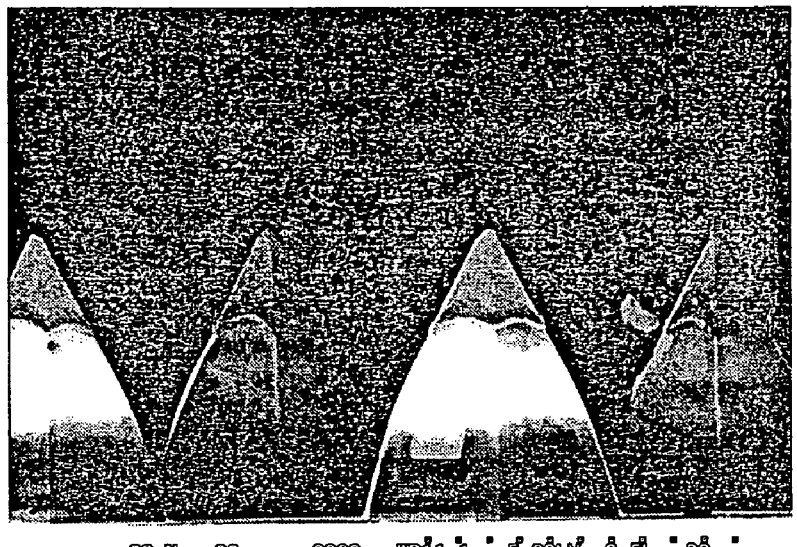
FIG. 7 is a scanning electron microscopic photograph of the surface configuration of a GaN-processed substrate immediately after formation of a light emitting element structure in the manufacturing method of the GaN-based light emitting diode according to an embodiment of the invention.
Figure 8:
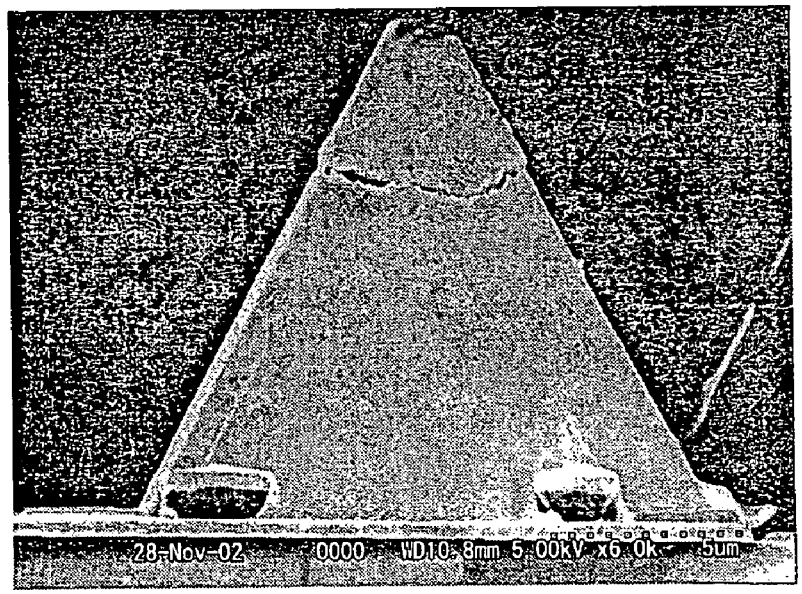
FIG. 8 is a scanning electron microscopic photograph of the surface configuration of a GaN-processed substrate immediately after formation of a light emitting element structure in a manufacturing method of a GaN-based compound light emitting diode taken for comparison with an embodiment of the invention.

FIG. 7 shows a photograph of the six-sided steeple-shaped n-type GaN layer 15 taken by a scanning electron microscope (SEM). The size D of the opening 13 in the growth mask 14 is 3 µm, and the pitch P is 10 µm. For comparison, FIG. 8 shows a SEM photograph of a conventional six-sided pyramidal n-type GaN layer having S-oriented inclined crystal planes. Size D of the opening 13 in the growth mask 14 is 10 µm, and pitch P is 29 µm.

Figure 9:
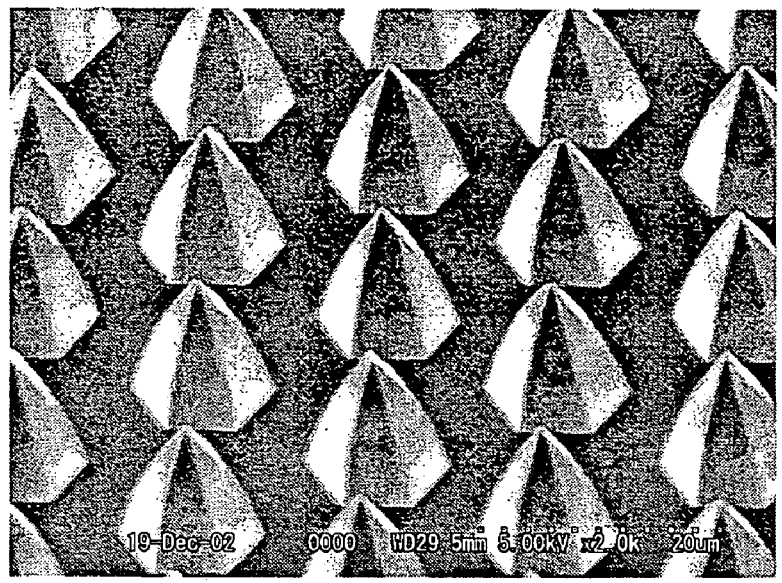
FIG. 9 is a scanning electron microscopic photograph of the surface configuration of a GaN-processed substrate immediately after formation of a light emitting element structure in the manufacturing method of the GaN-based light emitting diode according to an embodiment of the invention.
Figure 10:
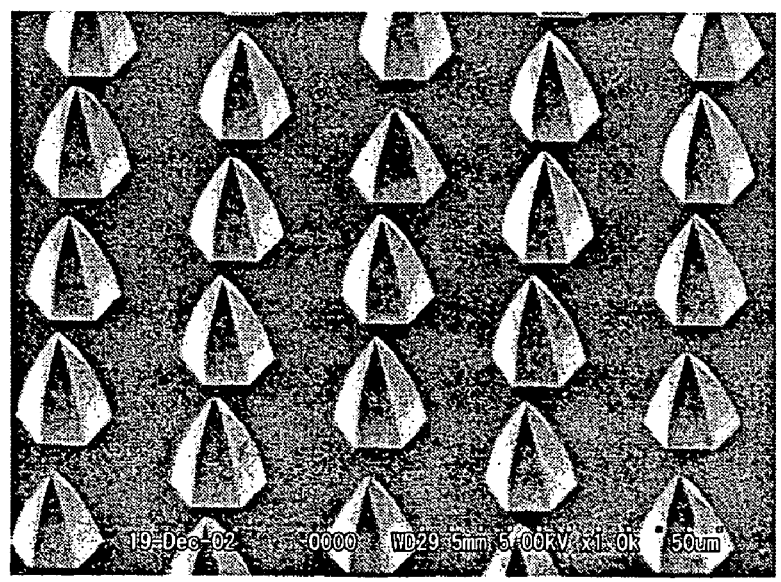
FIG. 10 is a scanning electron microscopic photograph of the surface configuration of a GaN-processed substrate immediately after formation of a light emitting element structure in the manufacturing method of the GaN-based light emitting diode according to an embodiment of the invention.

In addition, FIG. 9 shows a SEM photograph of an n-type GaN layer 15 in case of the size D of the opening 13 in the growth mask 14 being 3 µm and the pitch P being approximately 17 µm. FIG. 10 shows a SEM photograph of an n-type GaN layer 15 in case of the size D of the opening 13 in the growth mask 14 being 3 µm and the pitch P being approximately 28 µm (note that the scale is ½ of FIG. 9). It is appreciated from FIGS. 9 and 10 that the six-sided steeple-shaped n-type GaN layer 15 has a higher angle of inclination near the growth mask 14 in case the pitch P is approximately 28 µm than in case it is approximately 17 µm.

According to the first embodiment, the following various advantages can be obtained.

Figure 11:
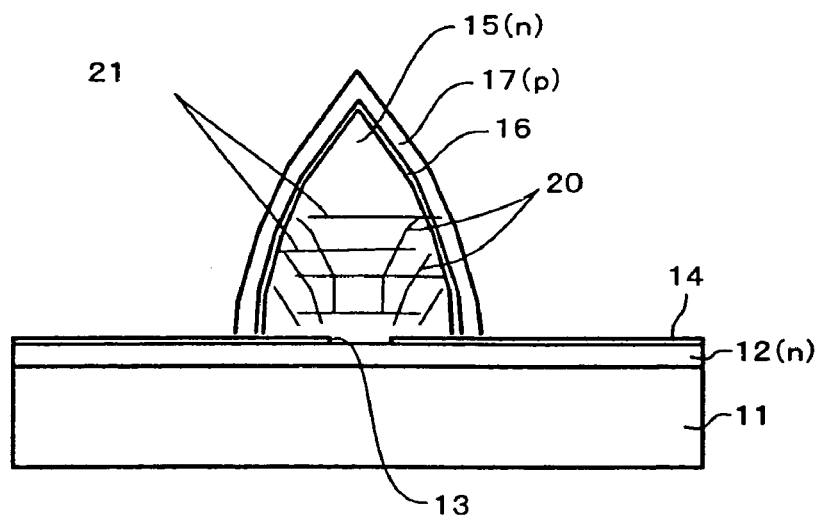
FIG. 11 is a cross-sectional view showing distribution of crystalline defects introduced in the process of growing GaN-based semiconductor layers forming the light emitting element structure in the manufacturing method of the GaN-based semiconductor light emitting diode according to an embodiment of the invention.

As shown in FIG. 11, while the n-type GaN layer 15 grows, dislocations 20 and depositional defects 21 therein. Some of them extend across the active layer 16, but they disappear at least in the portion close to the apex of the n-type GaN layer 15. Considering it, the first embodiment determines the size of the p-side electrode so that a drive current supplied between the p-side electrode 18 and the n-side electrode 19 does not flow the defective regions in the n-type GaN layer 15 and others. Therefore, the first embodiment can provide a GaN-based light emitting diode remarkably enhanced in emission efficiency and excellent in reliability as well.

Figure 12:
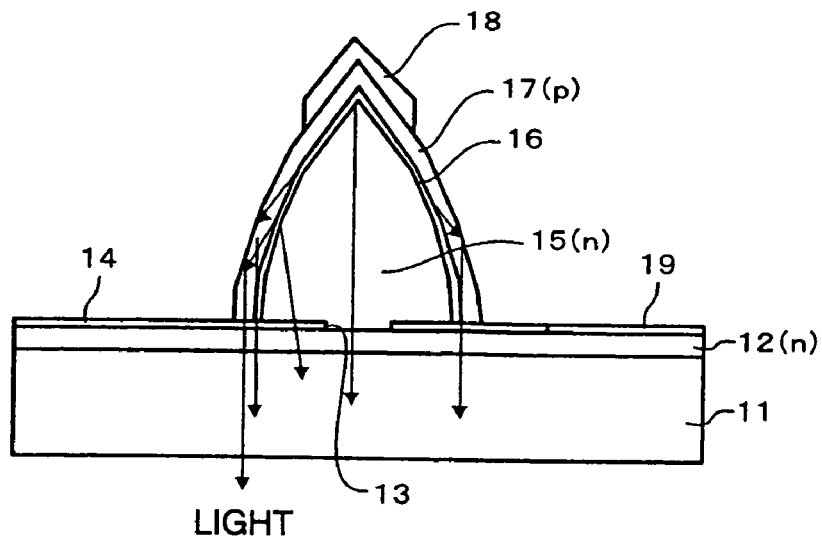
FIG. 12 is a cross-sectional view showing an aspect of emission from the GaN-based light emitting diode manufactured by an embodiment of the invention.

Further, the first embodiment grows the six-sided steeple-shaped n-type GaN layer 15 each composed of a plurality of crystal planes ($F_1$, $F_2$, $F_3$ and $F_4$) inclined from the major surface of the sapphire substrate 11 by different angles of inclination from each other to exhibit a convex crystal plane as a whole, and grows the active layer 16 and the p-type GaN layer 17 thereon. Thereby, the p-type GaN layer 17 also has inclined crystal planes similar to those of the n-type GaN layer 15. Therefore, when a drive current is supplied between the p-side electrode 18 and the n-side electrode 19, part of light toward the p-type GaN layer 17 in the light emitted from the active layer 16 is reflected at the outer surface of the p-type GaN layer 17 and travels toward the sapphire substrate 11. On the other hand, part of the light toward inside the n-type GaN layer 15 in the light emitted from the active layer 16 directly travels toward the sapphire substrate 11. As a result, the first embodiment can efficiently extract the light externally from the active layer 16 through the sapphire substrate 11, and can enhance the emission efficiency (see FIG. 12).

Figure 1B:
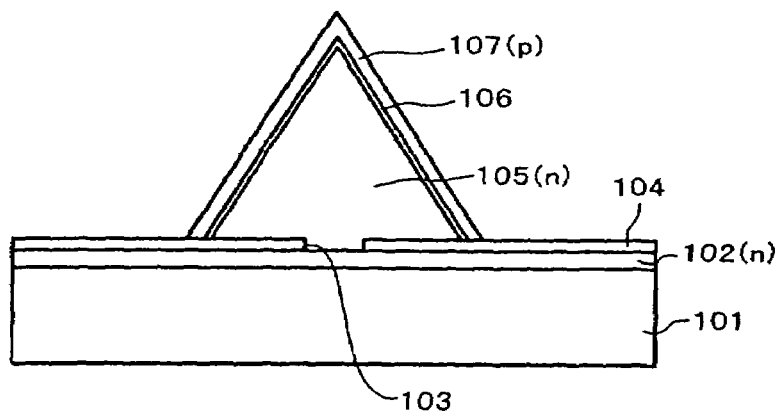

Moreover, in the GaN-based light emitting diode according to the first embodiment, the area occupied by each element can be made very small as compared with the conventional GaN-based light emitting diode shown in FIGS. 1A and 1B. For example, while the size of the six-sided pyramidal light emitting element structure of the conventional GaN-based light emitting diode is approximately 20 µm, the size of the six-sided steeple-shaped light emitting element structure of the GaN-based light emitting diode according to the first embodiment is much smaller, namely 10 µm approximately.

Furthermore, since the first embodiment uses the Ni/Ag/Au structure including Ag having a high reflectance as the p-side electrode 18, the first embodiment can enhance the reflectance of the upper part of the six-sided steeple-shaped p-type GaN layer 17, where the p-side electrode 18 is formed. Thereby, the first embodiment can further enhance the light extracting efficiency and can further enhance the emission efficiency.

In addition, according to the first embodiment, the light extracting direction can be made closer to the direction normal to the substrate surface. That is, distribution of emission from a light emitting element on a plane is usually called Lambertian, or called complete diffusion plane as well. In this case, emission is isotropic from all directions. However, if a black mask, or the like, is provided, light travels also toward the black mask. Therefore, to extract light forward, a lens is required. The first embodiment, however, can control the light extracting direction only by controlling the growth.

Next explained is a GaN-based light emitting diode according to the second embodiment of the invention.

Figure 13:
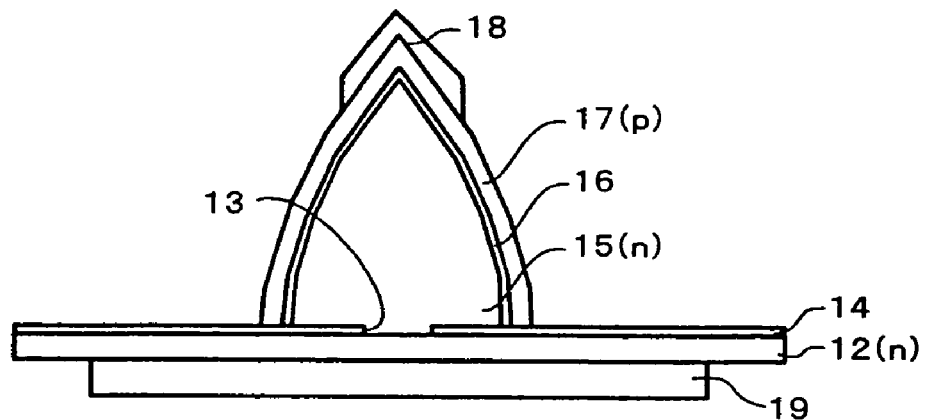
FIG. 13 is a cross-sectional view showing a GaN-based light emitting diode according to an embodiment of the invention.
Figure 14:
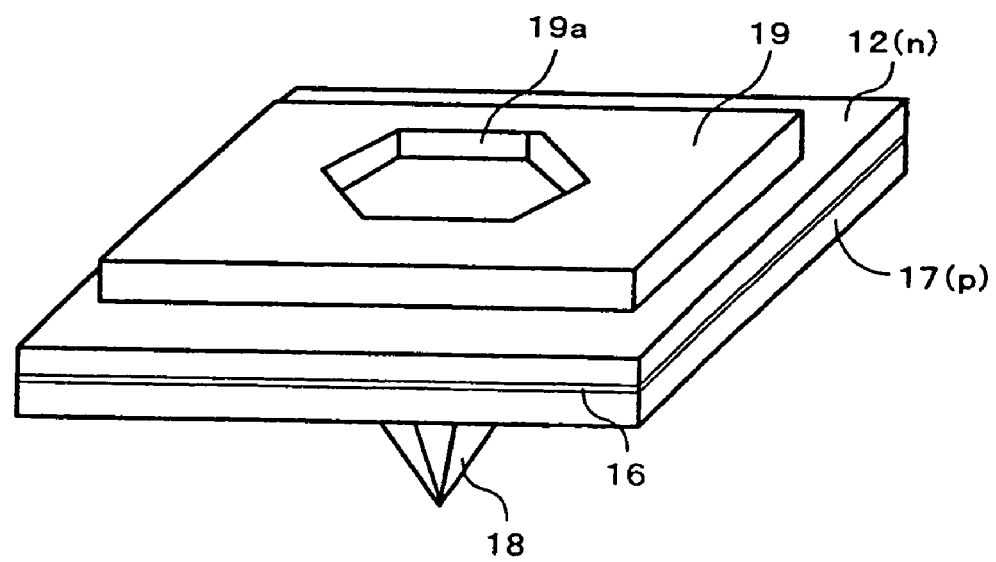
FIG. 14 is perspective view of the GaN-based light emitting diode according to an embodiment of the invention, taken from the side of its n-side electrode.

In the second embodiment, after the layers are grown up to the p-type GaN layer 17 by the same steps as those of the first embodiment, the p-side electrode 18 is formed on the p-type GaN layer 17. After that, the n-type GaN layer 12 and other upper layers are exfoliated from the sapphire substrate by irradiating a laser beam from the bottom of the sapphire substrate 11 with an excimer laser. Thereafter, the bottom surface of the exfoliated n-type GaN layer 12 is smoothed by etching, for example, and the n-side electrode 19 is formed on the smoothed bottom surface of the n-type GaN layer 12 as shown in FIG. 13. The n-side electrode 19 may be a transparent electrode made of ITO, for example. In this case, the n-side electrode 19 can be formed to lie over the wide area on the bottom surface of the n-type GaN layer 12 including the area under the six-sided steeple-shaped structure. In case the n-side electrode 19 is a Ti/Pt/Au structured metal laminated film, an opening 19a is provided in the n-side electrode 19 in alignment with the six-sided steeple-shaped n-type GaN layer 15 as shown in FIG. 14 to permit light to go out through the n-type GaN layer 12.

The second embodiment assures the same advantages as those of the first embodiment.

Figure 15:
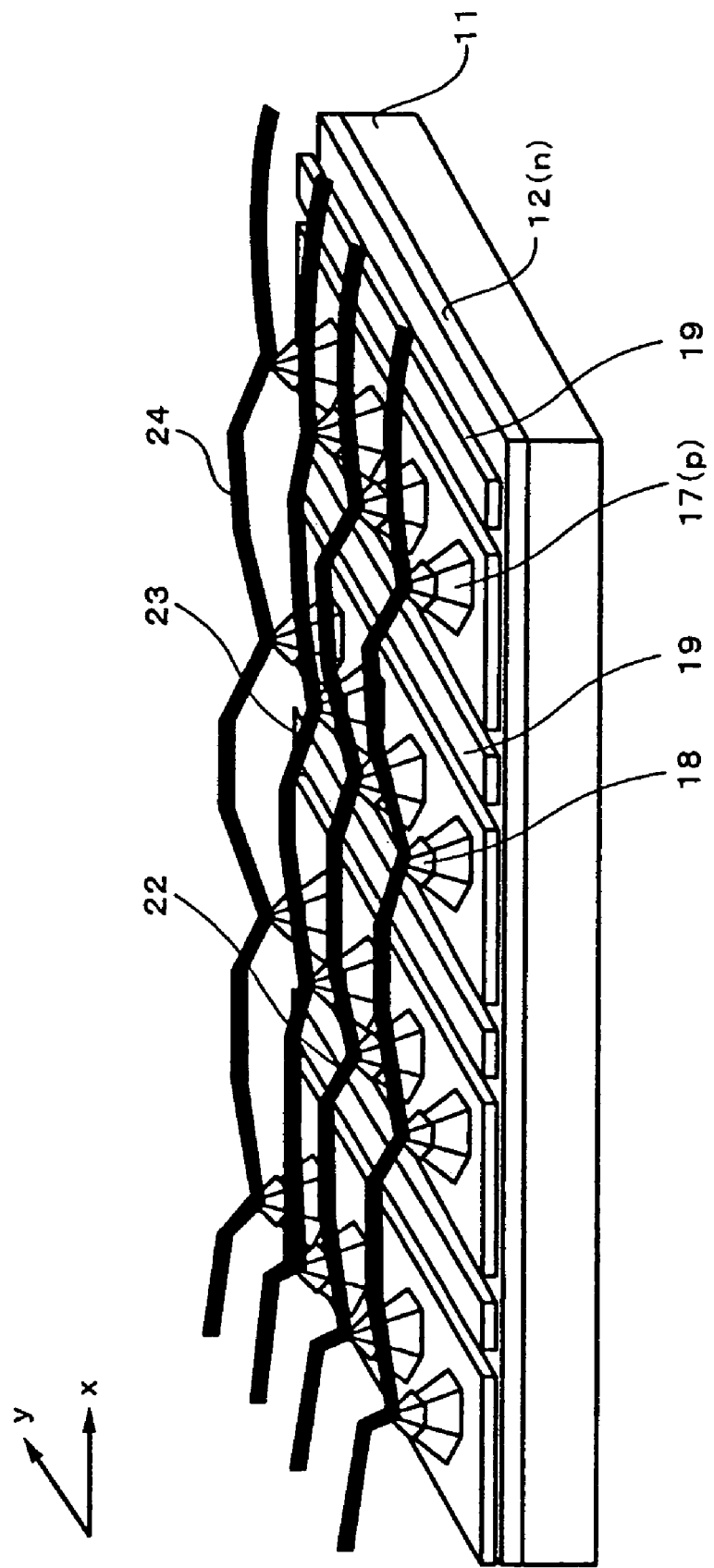
FIG. 15 is a perspective view showing an image display device according to an embodiment of the invention.

Next explained is an image display device according to the third embodiment of the invention. FIG. 15 shows the image display device.

As shown in FIG. 15, the image display device includes GaN-based light emitting diodes regularly aligned in the orthogonal x and y directions in a plane of a sapphire substrate 11 to make a two-dimensional array of GaN-based light emitting diodes. Structure of each GaN-based light emitting diode may be identical to that of the first embodiment, for example.

In the y direction, GaN-based light emitting diodes for emitting red (R), GaN-based light emitting diodes for emitting green (G) and GaN-based light emitting diodes for emitting blue (B) are aligned in a close relation, and three GaN-based light emitting diodes for different colors compose one pixel. Individual p-side electrodes 18 of GaN-based light emitting diodes for red aligned in the x direction are connected to each other by wiring 22. Similarly, p-side electrodes 18 of the GaN-based light emitting diodes for green aligned in the x direction are connected to each other by wiring 23, and p-side electrodes 18 of the GaN-based light emitting diodes for blue aligned in the x direction are connected to each other by wiring 24. On the other hand, n-side electrodes 19 extend in y directions and each functions as a common electrode of a series of GaN-based light emitting diodes aligned in the y direction.

The simple-matrix image display device having the above-explained configuration can display an image by selecting the wirings 22 to 24 and the n-side electrodes 19 depending upon a signal of an image to be displayed, thereby supplying a current to the selected GaN-based light emitting diodes of the selected pixel to drive them to emit light.

According to the third embodiment, each GaN-based light emitting diode has the same configuration as that of the first embodiment and therefore has high emission efficiency. Thus, a high-luminance full-color image display device can be realized.

Next explained is an illuminating device according to the fourth embodiment of the invention. The illuminating device has the same configuration as the image display device shown in FIG. 15.

The illuminating device can emit illuminating light by selecting the wirings 22 to 24 and the n-side electrodes 19 depending upon the color of the illuminating light, thereby supplying a current to the selected GaN-based light emitting diodes of the selected pixel to drive them to emit light.

According to the fourth embodiment, each GaN-based light emitting diode has the same configuration as that of the first embodiment and therefore has high emission efficiency. Thus, a high-luminance full-color illuminating device can be realized.

Figure 16A:
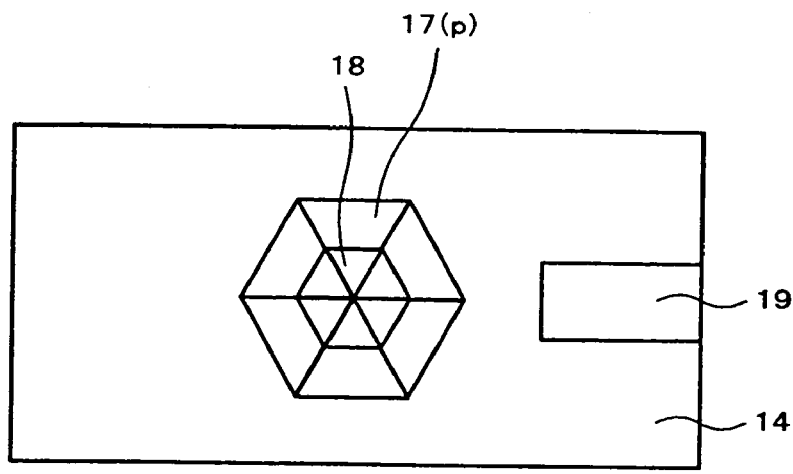
FIGS. 16A and 16B are a plan view and a cross-sectional view showing a GaN-based light emitting diode according to an embodiment of the invention.
Figure 16B:
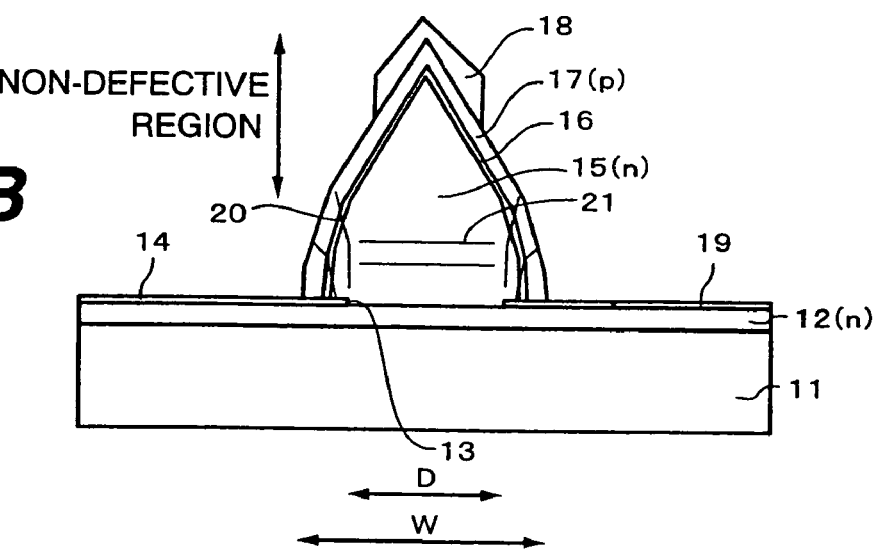

Next explained is a GaN-based light emitting diode according to the fifth embodiment of the invention. This GaN-based light emitting diode is illustrated in FIGS. 16A and 16B.

In the fifth embodiment, the GaN-based semiconductor diode is manufactured in the same manner as the first embodiment. However, the fifth embodiment is different from the first embodiment in that the size D of the opening 13 in the growth mask 14 is D=10 μm and the pitch P is P=28 μm.

According to the fifth embodiment, since the opening in the growth mask 14 has the relatively small size D=10 μm, it diminishes the region liable to generate dislocations 20 and depositional defects 21 during selective growth of the n-type GaN layer 15, and thereby reduces adverse influence of these crystal defects to emission of light. As a result, a GaN-based light emitting diode enhanced in emission efficiency and reliability can be obtained. For example, when the drive current is 200 μA, emission output of 25 μW is obtained. In addition, the fifth embodiment ensures the same advantages as those of the first embodiment.

Figure 17A:
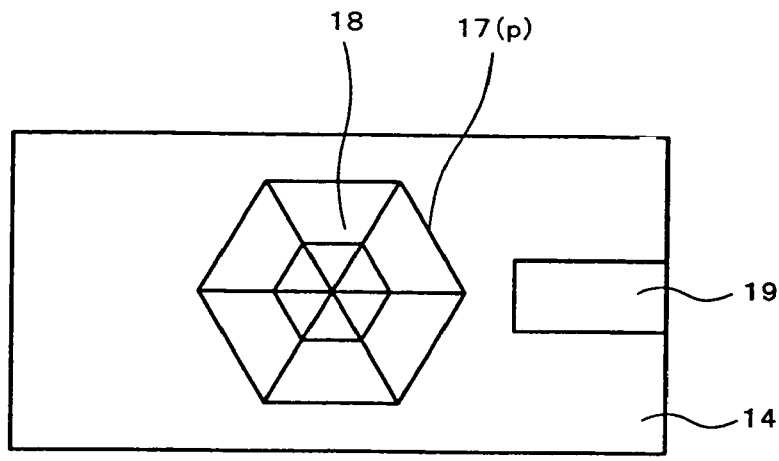
FIGS. 17A and 17B are a plan view and a cross-sectional view showing a GaN-based light emitting diode according to an embodiment of the invention.
Figure 17B:
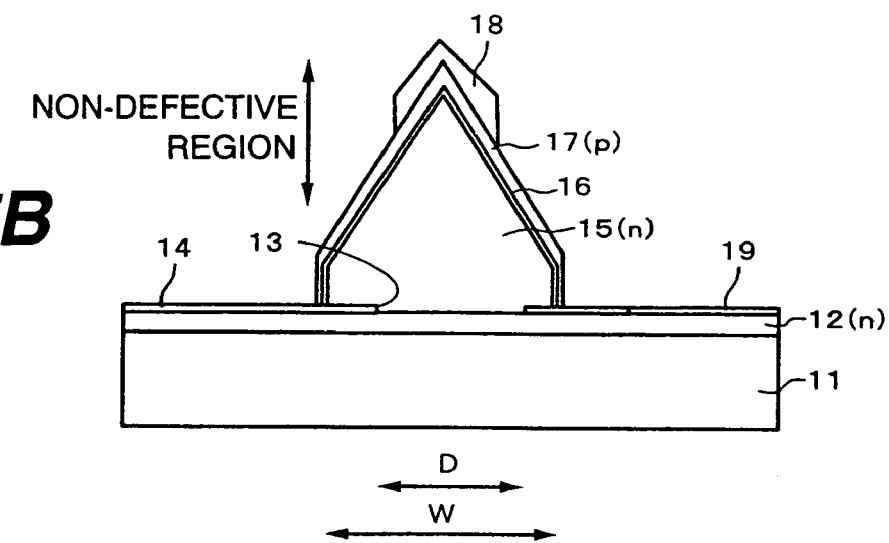

Next explained is a GaN-based light emitting diode according to the sixth embodiment of the invention. FIGS. 17A and 17B show this GaN-based light emitting diode.

In the sixth embodiment, the growth mask 14 having openings 13 is formed in the same manner as the first embodiment. However, unlike the first embodiment, the size D of the opening 13 is D=10 μm, and the pitch P is P=28 μm. Then, under the existence of this growth mask 14, the n-type GaN layer 15 is selectively grown. In this process, the growth temperature is set at 1020° C., for example, and the growth rate is set to 4 μm/h in planar growth reduction. In the process of this selective growth, the growth rate may be lowered by lowering the growth temperature than 1020° C. to render the growth slower near the interface with the n-type GaN layer 12. However, for the growth of the most part excluding the proximity to the interface with the n-type GaN layer 12, the growth temperature is raised to 1020° C., and the growth rate is raised to 4 μm/h in planar growth reduction. After that, the growth is continued at the lower growth rate of 0.5 μm/h. As a result, the steeple-shaped n-type GaN layer 15 grows with inclined crystal planes each exhibiting a convex plane as a whole as shown in FIGS. 17A and 17B. In this case, the inclined crystal planes comprise M-oriented or less inclined crystal planes formed on side surfaces of the lower part of the n-type GaN layer 15 and S-oriented planes formed on side surfaces of the upper part of the n-type GaN layer 15.

After that, the process is continued in the same manner as the first embodiment, and the GaN-based light emitting diode shown in FIGS. 17A and 17B is completed. In this case, size W of the light emitting element is W=13 μm.

According to the sixth embodiment, the same advantages as those of the first and second embodiments can be obtained. For example, when the drive current is 200 μA, emission output of 25 μW is obtained.

Figure 18A:
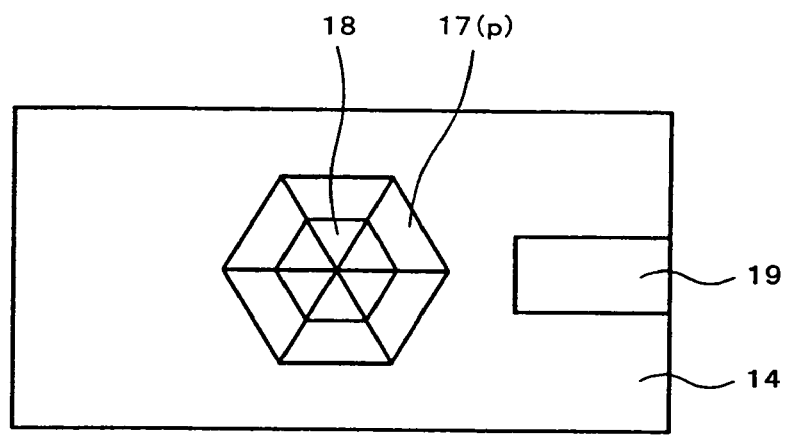
FIGS. 18A and 18B are a plan view and a cross-sectional view showing a GaN-based light emitting diode according to an embodiment of the invention.
Figure 18B:
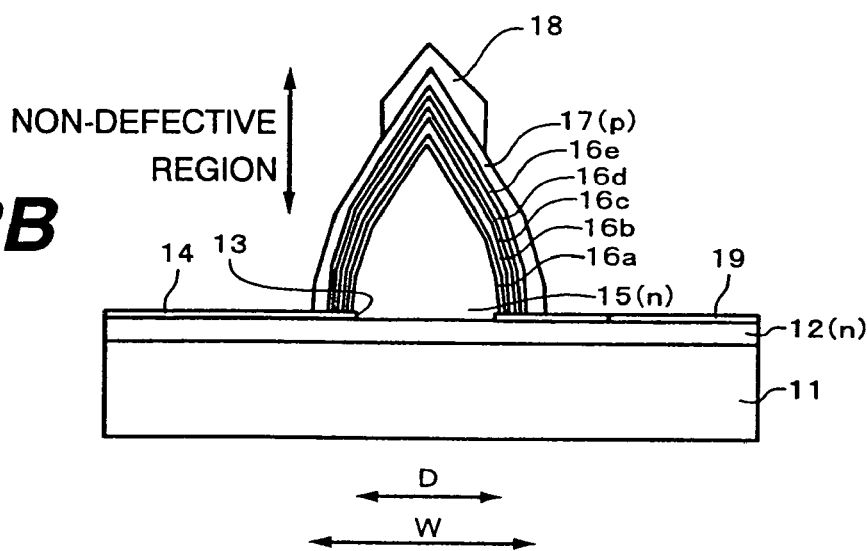

Next explained is a GaN-based light emitting diode according to the seventh embodiment of the invention. FIGS. 18A and 18B illustrate this GaN-based light emitting diode.

In the seventh embodiment, the growth mask 14 having openings 13 is formed in the same manner as the first embodiment. However, size D of the opening 13 is D=10 μm, and the pitch P is P=28 μm. Subsequently, similarly to the first embodiment, the n-type GaN layer 15 is selectively grown under the existence of the growth mask 14, and the active layer 16 and the p-type GaN layer 17 are grown thereon. In this embodiment, the active layer 16 has a MQW structure composed of a barrier layer 16a, well layer 16b, barrier layer 16c, well layer 16d and barrier layer 16e. The barrier layer 16a, well layer 16b, barrier layer 16c, well layer 16d and barrier layer 16e may be InGaN layers, for example. In this case, size W of the light emitting structure is W=13 μm.

After that, the process is continued similarly to the first embodiment to complete the GaN-based light emitting diode shown in FIGS. 18A and 18B.

According to the seventh embodiment, the same advantages as those of the first and second embodiments can be obtained. For example, when the drive current is 200 μA, emission output of 80 μW is obtained.

Figure 19A:
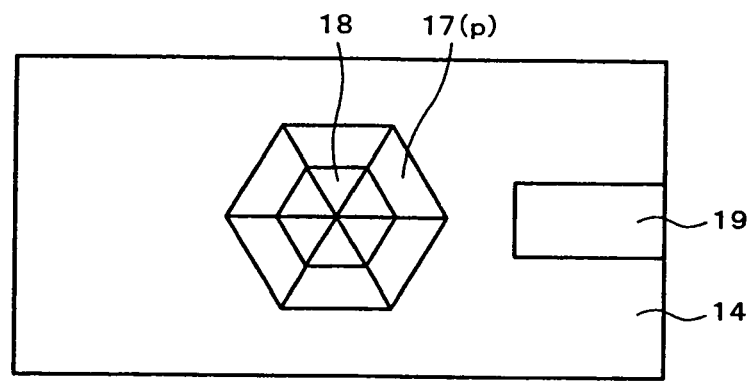
FIGS. 19A and 19B are a plan view and a cross-sectional view showing a GaN-based light emitting diode according to an embodiment of the invention.
Figure 19B:
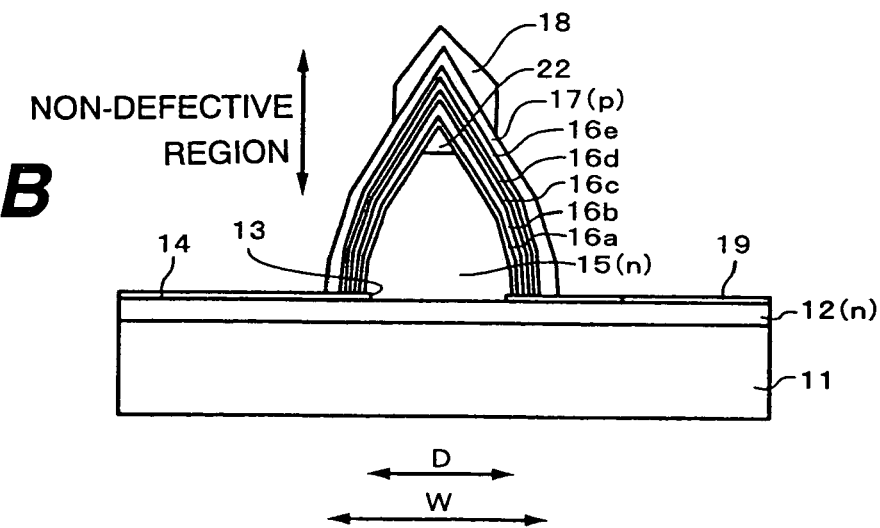

Next explained is a GaN-based light emitting diode according to the eighth embodiment of the invention. FIGS. 19A and 19B illustrate this GaN-based light emitting diode.

In the eighth embodiment, the growth mask 14 having openings 13 is formed in the same manner as the first embodiment. However, unlike the first embodiment, the size D of the opening 13 is D=10 μm, and the pitch P is P=28 μm. Then, under the existence of this growth mask 14, the n-type GaN layer 15 is selectively grown. In this process, the growth temperature is set at 940° C., for example, and the growth rate is set at a very high rate of 11.0 to 11.3 μm/h in planar growth reduction. In the process of this selective growth, the growth rate may be lowered by lowering the growth temperature than 940° C. to render the growth slower near the interface with the n-type GaN layer 12. However, for the growth of the most part excluding the proximity to the interface with the n-type GaN layer 12, the growth temperature is raised to 940° C., and the growth rate is raised to the very high rate of 11.0 to 11.3 μm/h in planar growth reduction. After that, the growth is continued at the lower growth rate of 0.5 μm/h. As a result, the steeple-shaped n-type GaN layer 15 grows in form of a six-sided frustum-shaped steeple having the inclined crystal planes each exhibiting a convex plane as a whole and having a C-oriented or quasi-C-oriented crystal plane on the top of the apex portion as shown in FIGS. 19A and 19B. Subsequently, an undoped GaN layer 22 is grown to a thickness around 100 nm to close the six-sided pyramid on the apex portion of the n-type GaN layer 15 at the growth temperature of 940° C., for example and the growth rate of 11.0 to 11.3 μm/h. The undoped GaN layer 22 serves as a current-blocking region.

After that, the process is continued in the same manner as the first embodiment to complete the GaN-based light emitting diode shown in FIGS. 19A and 19B. In this case, size W of the light emitting structure is W=13 μm.

According to the eighth embodiment, the same advantages as those of the first and second embodiments can be obtained. Especially, since the undoped GaN layer 22 serves as a current-blocking region and can prevent a drive current from flowing through crystallographically inferior regions, the eighth embodiment attains greater emission efficiency. For example, when the drive current is 200 μA, emission output of 80 μW is obtained.

Figure 20A:
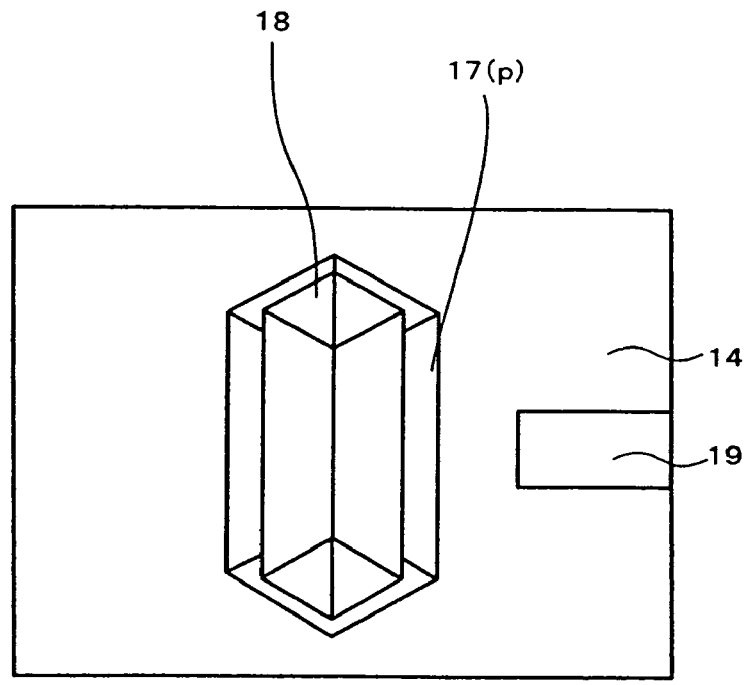
FIGS. 20A and 20B are a plan view and a cross-sectional view showing a GaN-based light emitting diode according to an embodiment of the invention.
Figure 20B:
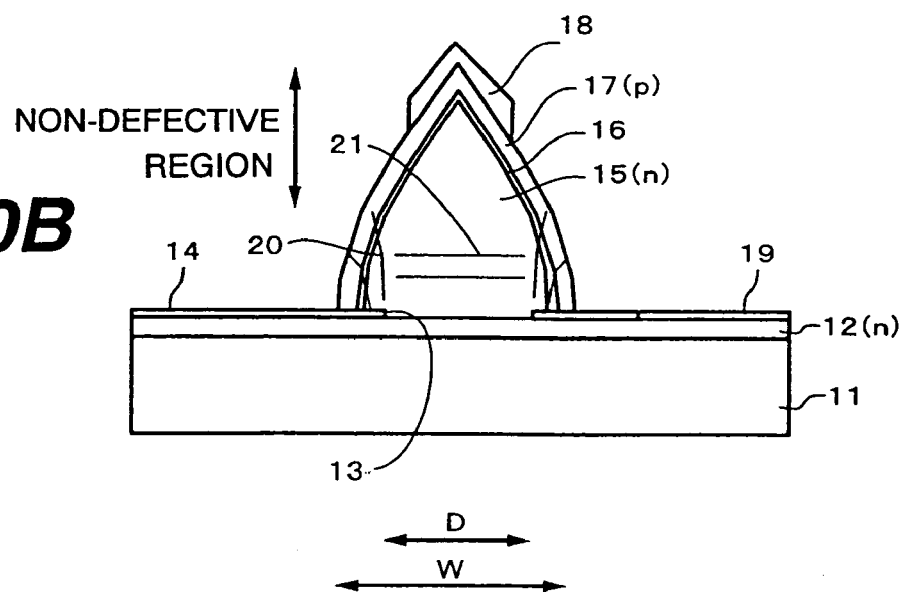

Next explained is a GaN-based light emitting diode according to the ninth embodiment of the invention. FIGS. 20A and 20B illustrate this GaN-based light emitting diode.

In the ninth embodiment, the growth mask 14 having openings 13 is formed in the same manner as the first embodiment. However, unlike the first embodiment, the opening 13 has the form of an elongated hexagon that may have, for example, the maximum size of 30 μm, minimum size of 10 μm in the direction normal to the direction of the maximum size and the pitch P of 28 μm. Then, under the existence of this growth mask 14, the n-type GaN layer 15 is selectively grown. In this process, the growth temperature is set at 940° C., for example, and the growth rate is set at a very high rate of 11.0 to 11.3 μm/h in planar growth reduction. In the process of this selective growth, the growth rate may be lowered by lowering the growth temperature than 940° C. to render the growth slower near the interface with the n-type GaN layer 12. However, for the growth of the most part excluding the proximity to the interface with the n-type GaN layer 12, the growth temperature is raised to 940° C., and the growth rate is raised to the very high rate of 11.0 to 11.3 μm/h in planar growth reduction. As a result, in a cross-sectional view taken along the direction of the minimum size of the opening in the growth mask 14, the steeple-shaped n-type GaN layer 15 grows to expand in the direction normal to the cross section and include inclined crystal planes each exhibiting a convex plane as a whole, as shown in FIGS. 20A and 20B.

After that, the process is continued in the same manner as the first embodiment to complete the GaN-based light emitting diode shown in FIGS. 20A and 20B. In this case, size W of the light emitting structure is W=13 μm.

According to the ninth embodiment, the same advantages as those of the first and second embodiments can be obtained. For example, when the drive current is 200 μA, emission output of 80 μW is obtained.

Figure 21A:
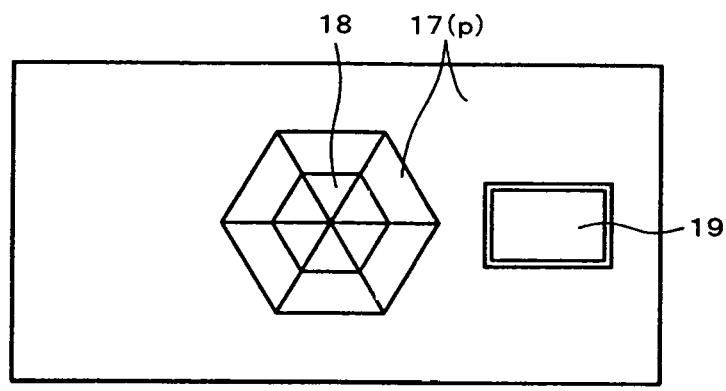
FIGS. 21A and 21B are a plan view and a cross-sectional view showing a GaN-based light emitting diode according to an embodiment of the invention.
Figure 21B:
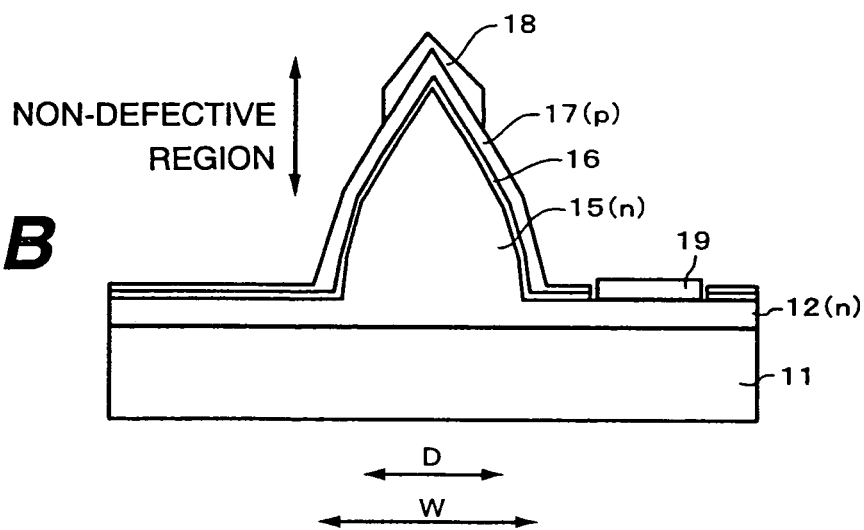

Next explained is a GaN-based light emitting diode according to the tenth embodiment of the invention. FIGS. 21A and 21B illustrate this GaN-based light emitting diode.

In the tenth embodiment, the growth mask 14 having openings 13 is formed in the same manner as the first embodiment. However, unlike the first embodiment, the size D of the opening 13 is D=10 μm, and the pitch P is P=28 μm. Then, under the existence of this growth mask 14, the n-type GaN layer 15 is selectively grown. In this process, the growth temperature is set at 940° C., for example, and the growth rate is set at a very high rate of 11.0 to 11.3 μm/h in planar growth reduction. In the process of this selective growth, the growth rate may be lowered by lowering the growth temperature than 940° C. to render the growth slower near the interface with the n-type GaN layer 12. However, for the growth of the most part excluding the proximity to the interface with the n-type GaN layer 12, the growth temperature is raised to 940° C., and the growth rate is raised to the very high rate of 11.0 to 11.3 μm/h in planar growth reduction.

After that, the growth mask is removed by wet etching using a fluoric acid-based etchant, for example, or by RIE using an etching gas containing fluorine, such as $CF_4$, $CFH_3$, or the like.

Thereafter, an n-type GaN layer (not shown) is grown to a thickness around 1 μm, for example, at the growth temperature of 960° C., for example. Consecutively, the active layer 16 and the p-type GaN layer 17 are grown on the clean surface of the n-type GaN layer. In this case, size W of the light emitting structure is W=13 μm.

After that, the process is continued in the same manner as the first embodiment up to the p-side electrode 18.

Subsequently, a resist pattern (not shown) is formed by lithography to cover the p-type GaN layer 17 in the region excluding the region for forming the n-side electrode. Under the resist pattern as a mask, the p-type GaN layer 17 and the active layer 16 are selectively removed by etching by RIE, for example, to make an opening and expose the n-type GaN layer 12 through the opening. Thereafter, the resist pattern is removed. Then, a Ti film, Pt film and Au film are formed sequentially on the entire substrate surface by vacuum evaporation, for example, and a resist pattern of a predetermined geometry is formed thereon by lithography. Under the resist pattern as a mask, the Ti film, Pt film and Au film are etched. As a result, the n-side electrode 19 of the Ti/Pt/Au structure is formed in contact with the n-type GaN layer 12 through the opening formed in the p-type GaN layer 17 and the active layer 16.

According to the tenth embodiment, the same advantages as those of the first and second embodiments can be obtained. For example, when the drive current is 200 μA, emission output of 25 μW is obtained.

In addition, the tenth embodiment has the following advantages. As already explained, the conventional GaN-based light emitting diode needs the process of selectively growing the six-sided pyramidal n-type GaN layer having inclined crystal planes inclined from the major surface of the substrate on the n-type GaN layer exposed through the opening in the growth mask of silicon oxide ($SiO_2$) or silicon nitride (SiN); and the process of growing the active layer, p-type GaN layer and others on the inclined crystal plane under the existence of the growth mask retained. However, since the selective growth of the n-type GaN layer and the later growth of the p-type GaN layer are carried out at a high temperature of 900° C. or more, there may arise the phenomenon that silicon (Si) and oxygen (O) are eliminated from the surface of the growth mask and incorporated into layers grown near around during the growth. Adverse influences of this phenomenon are especially serious during the growth of the p-type GaN layer. It has been found that if Si workable as an n-type impurity of GaN is incorporated into the p-type GaN layer while it grows, the intended p-type is difficult to obtain and that even if a p-type is obtained, both the hole concentration and the mobility seriously decrease, thereby disturbing enhancement of the emission efficiency of the light emitting diode. Further, the conventional GaN-based light emitting diode needs the process of lithography for making the opening in the growth mask, and this process needs the process of bringing the resist into close contact with the mask surface to locally remove it. In this removal process, however, the resist is liable to remain in minute gaps of the growth mask and very difficult to remove. In later growth at a high temperature, any residual resist may become an impurity source and may deteriorate the property of a p-type GaN layer, or the like. In contrast, in the tenth embodiment, since the growth mask 14 is removed by etching before the growth of the active layer 16 and the p-type GaN layer 17, the growth mask 14 does not exist when the active layer 16 and the p-type GaN layer 17 are grown. Thus, the tenth embodiment is free from the problem of undesirable incorporation of Si from the growth mask 14 into layers grown thereon, and free from the problem of contamination by the resist. Therefore, the tenth embodiment assures the growth of a sufficiently Mg-doped and low-resistant p-type GaN layer 17, and enables further enhancement of the emission efficiency of the GaN light emitting diode.

Heretofore, specific embodiments of the invention have been explained. However, the invention is not limited to these embodiments but contemplated various changes and modifications based on the technical concept of the invention.

For example, numerical values, materials, structures, shaped, substrates, source materials, processes, and so on, which have been raised in the explanation of the first to tenth embodiments are nothing but examples, and other numerical values, materials, structures, shaped, substrates, source materials, processes, and so on, may be used where necessary.

More specifically, to enhance the property of the active layer 16 in the first to tenth embodiment, for example, an AlGaN layer excellent in light confinement property may be formed near the active layer 16, and/or an InGaN layer having a small In composition, for example, may be formed. If an effect of diminishing the band gap by so-called bowing is desirable, Al is added to InGaN to make AlGaInN. Moreover, an optical guide layer may be interposed between the active layer 16 and the n-type GaN layer 12 and/or between the active layer 16 and the p-type GaN layer 17, if necessary.

Although the first to tenth embodiments use a sapphire substrate, any other substrate such as a SiC substrate, Si substrate, or the like, may be used where appropriate. Alternatively, a GaN substrate made by a lateral crystal growth technique such as ELO (Epitaxial Lateral Overgrowth) or Pendeo may be used.

In the first to tenth embodiments, a contact metal layer of Ni, Pd, Co, Sb, or the like, having a thickness equal to or larger than the wavelength permitting penetration of light generated in the active layer 16 may be interposed between the p-type GaN layer 17 and the p-side electrode 18. In this case, the effect of enhancing reflection by the contact metal layer further enhanced the emission efficiency of the GaN-based light emitting diode.

In the third and fourth embodiments, a plurality of GaN-based light emitting diodes are monolithically formed on the sapphire substrate. However, the GaN-based light emitting diodes monolithically formed on the sapphire substrate 11 may be divided to discrete elements, then mounted in the same layout as the third and fourth embodiments on a base and connected by wirings in the same configuration as explained before.

As described above, according to the invention, the semiconductor layer of the first conduction type is formed on a major surface to include a convex crystal portion having an inclined crystal plane that comprises a plurality of crystal planes inclined from the major surface by different angles of inclination to exhibit a convex plane as a whole, or an inclined crystal plane exhibiting a substantially convex plane as a whole. Then, at least on the inclined crystal plane, at least the active layer and the semiconductor layer of the second conduction type are deposited sequentially to make the light emitting element structure. Therefore, the invention can provide a semiconductor light emitting element, integrated semiconductor light emitting device, image display device and illuminating device, which are significantly enhanced in emission efficiency and small in occupied area per each element.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A method of manufacturing a semiconductor light emitting element having a semiconductor layer of a first conduction type which is formed on a major surface and includes a convex crystal portion having an inclined crystal plane composed of a plurality of crystal planes inclined from the major surface by different angles of inclination to exhibit a convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, the method comprising:
growing a first semiconductor layer of the first conduction type on a substrate;
forming a growth mask having an opening at a predetermined position on the first semiconductor layer;
selectively growing a second semiconductor layer of the first conduction type on the first semiconductor layer exposed through the opening in the growth mask;
sequentially growing at least the active layer and the semiconductor layer of the second conduction type to cover the second semiconductor layer; and
removing the growth mask between selectively growing the second semiconductor layer of the first conduction type on the first semiconductor layer exposed through the opening in the growth mask and sequentially growing at least the active layer and the semiconductor layer of the second conduction type.

2. The method of manufacturing a semiconductor light emitting element according to claim 1 wherein the growth mask includes a lamination of at least one of silicon nitride, silicon oxide nitride and silicon oxide.

3. The method of manufacturing a semiconductor light emitting element according to claim 1 wherein at least the surface of the growth mask includes silicon nitride.

4. The method of manufacturing a semiconductor light emitting element according to claim 1 wherein the size of the opening in the growth mask ranges from about 2 μm to about 13 μm.

5. The method of manufacturing a semiconductor light emitting element according to claim 1 wherein the crystal portion has a wurtzite crystal structure.

6. The method of manufacturing a semiconductor light emitting element according to claim 1 wherein the crystal portion includes a nitride III-V compound semiconductor.

7. The method of manufacturing a semiconductor light emitting element according to claim 1 wherein the semiconductor layer of the first conduction type, the first semiconductor layer, the second semiconductor layer, the active layer and the semiconductor layer of the second conduction type include nitride III-V compound semiconductors.

8. The method of manufacturing a semiconductor light emitting element according to claim 4 wherein the crystal planes composing the inclined crystal plane are S-oriented planes.

9. The method of manufacturing a semiconductor light emitting element according to claim 5 wherein the angles of inclination of the crystal planes composing the inclined crystal plane is stepwise smaller from a bottom of the crystal portion toward an apex thereof.

10. The method of manufacturing a semiconductor light emitting element according to claim 1 wherein the crystal portion is steeple-shaped.

11. The method of manufacturing a semiconductor light emitting element according to claim 1 wherein the crystal portion has a six-sided steeple configuration.

12. The method of manufacturing a semiconductor light emitting element according to claim 1 wherein the crystal portion is elongate in a direction parallel to the major surface.

13. The method of manufacturing a semiconductor light emitting element according to claim 1 wherein growth temperature for the selective growth is controlled and from about 920° C. to about 960° C.

14. The method of manufacturing a semiconductor light emitting element according to claim 1 wherein a growth rate for the selective growth is controlled at about 6 μm/h or greater.

15. The method of manufacturing a semiconductor light emitting element according to claim 1 wherein the growth temperature for the active layer and the semiconductor layer of the second conduction type is set lower than the growth temperature for selective growth of the second semiconductor layer.

16. The method of manufacturing a semiconductor light emitting element according to claim 1 wherein after the second semiconductor layer is selectively grown to have a crystal plane substantially parallel to the major surface on the top thereof, an undoped semiconductor layer is grown on the top of the second semiconductor layer.

17. A method of manufacturing an integrated semiconductor light emitting device integrating a plurality of integrated light emitting elements each having a semiconductor layer of a first conduction type which is formed on a major surface and includes a convex crystal portion having an inclined crystal plane composed of a plurality of crystal planes inclined from the major surface by different angles of inclination to exhibit a convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, the method comprising:
growing a first semiconductor layer of the first conduction type on a substrate;
forming a growth mask having openings at predetermined positions on the first semiconductor layer;
selectively growing a second semiconductor layer of the first conduction type on the first semiconductor layer exposed through the openings in the growth mask;
sequentially growing at least the active layer and the semiconductor layer of the second conduction type to cover the second semiconductor layer; and
removing the growth mask between selectively growing the second semiconductor layer of the first conduction type on the first semiconductor layer exposed through the opening in the growth mask and sequentially growing at least the active layer and the semiconductor layer of the second conduction type.

18. The method of manufacturing an integrated semiconductor light emitting device according to claim 17 wherein a size of each opening in the growth mask ranges from about 4/1 to about 1 time a size of each semiconductor light emitting element.

19. The method of manufacturing an integrated semiconductor light emitting device according to claim 17 wherein a distance between nearest two of the openings is equal to or more than two times the size of each semiconductor light emitting element.

20. The method of manufacturing an integrated semiconductor light emitting device according to claim 17 wherein a size of each opening in the growth mask ranges from about 2 μm to about 13 μm.

21. The method of manufacturing an integrated semiconductor light emitting device according to claim 17 wherein a distance between nearest two of the openings is equal to or more than about 10 μm.

22. A method of manufacturing an image display device integrating a plurality of integrated light emitting elements each having a semiconductor layer of a first conduction type which is formed on a major surface and includes a convex crystal portion having an inclined crystal plane composed of a plurality of crystal planes inclined from the major surface by different angles of inclination to exhibit a convex plane; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having openings at predetermined positions on the first semiconductor layer;

selectively growing a second semiconductor layer of the first conduction type on the first semiconductor layer exposed through the openings in the growth mask;

sequentially growing at least the active layer and the semiconductor layer of the second conduction type to cover the second semiconductor layer; and removing the growth mask between selectively growing the second semiconductor layer of the first conduction type on the first semiconductor layer exposed through the opening in the growth mask and sequentially growing at least the active layer and the semiconductor layer of the second conduction type.

23. A method of manufacturing an illuminating device having a single semiconductor light emitting element or a plurality of integrated semiconductor light emitting elements each including a semiconductor layer of a first conduction type which is formed on a major surface and includes a convex crystal portion having an inclined crystal plane composed of a plurality of crystal planes inclined from the major surface by different angles of inclination to exhibit a convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, comprising:

growing a first semiconductor layer of the first conduction type on a substrate;

forming a growth mask having an opening at a predetermined position on the first semiconductor layer;

selectively growing a second semiconductor layer of the first conduction type on the first semiconductor layer exposed through the opening in the growth mask;

sequentially growing at least the active layer and the semiconductor layer of the second conduction type to cover the second semiconductor layer; and removing the growth mask between selectively growing the second semiconductor layer of the first conduction type on the first semiconductor layer exposed through the opening in the growth mask and sequentially growing at least the active layer and the semiconductor layer of the second conduction type.

24. A method of manufacturing a semiconductor light emitting element having a semiconductor layer of a first conduction type which is formed on a major surface and includes a convex crystal portion having an inclined crystal plane exhibiting a substantially convex plane; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, the method comprising:

growing a first semiconductor layer of the first conduction type on a substrate;

forming a growth mask having an opening at a predetermined position on the first semiconductor layer;

selectively growing a second semiconductor layer of the first conduction type on the first semiconductor layer exposed through the opening in the growth mask;

sequentially growing at least the active layer and the semiconductor layer of the second conduction type to cover the second semiconductor layer; and removing the growth mask between selectively growing the second semiconductor layer of the first conduction type on the first semiconductor layer exposed through the opening in the growth mask and sequentially growing at least the active layer and the semiconductor layer of the second conduction type.

25. A method of manufacturing an integrated semiconductor light emitting device including a plurality of integrated semiconductor light emitting elements each having: a semiconductor layer of a first conduction type which is formed on a major surface and includes a convex crystal portion having an inclined crystal plane exhibiting a substantially convex plane; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, the method comprising:

growing a first semiconductor layer of the first conduction type on a substrate;

forming a growth mask having openings at predetermined positions on the first semiconductor layer;

selectively growing a second semiconductor layer of the first conduction type on the first semiconductor layer exposed through the openings in the growth mask;

sequentially growing at least the active layer and the semiconductor layer of the second conduction type to cover the second semiconductor layer; and removing the growth mask between selectively growing the second semiconductor layer of the first conduction type on the first semiconductor layer exposed through the opening in the growth mask and sequentially growing at least the active layer and the semiconductor layer of the second conduction type.

26. A method of manufacturing an image display device integrating a plurality of integrated light emitting elements each having a semiconductor layer of a first conduction type which is formed on a major surface and includes a convex crystal portion having an inclined crystal plane exhibiting a substantially convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, the method comprising:

growing a first semiconductor layer of the first conduction type on a substrate;

forming a growth mask having openings at predetermined positions on the first semiconductor layer;

selectively growing a second semiconductor layer of the first conduction type on the first semiconductor layer exposed through the openings in the growth mask;

sequentially growing at least the active layer and the semiconductor layer of the second conduction type to cover the second semiconductor layer; and removing the growth mask between selectively growing the second semiconductor layer of the first conduction type on the first semiconductor layer exposed through the opening in the growth mask and sequentially growing at least the active layer and the semiconductor layer of the second conduction type.

27. A method of manufacturing an illuminating device having a single semiconductor light emitting element or a plurality of integrated semiconductor light emitting elements each including: a semiconductor layer of a first conduction type which is formed on a major surface and includes a convex crystal portion having an inclined crystal plane exhibiting a substantially convex plane as a whole; at least an active layer and a semiconductor layer of a second conduction type which are sequentially layered at least on the inclined crystal plane of the crystal portion; a first electrode electrically connected to the semiconductor layer of the first conduction type; and a second electrode formed on the semiconductor layer of the second conduction type on the crystal portion and electrically connected to the semiconductor layer of the second conduction type, the method comprising:

growing a first semiconductor layer of the first conduction type on a substrate;

forming a growth mask having an opening at a predetermined position on the first semiconductor layer;

selectively growing a second semiconductor layer of the first conduction type on the first semiconductor layer exposed through the opening in the growth mask;

sequentially growing at least the active layer and the semiconductor layer of the second conduction type to cover the second semiconductor layer; and removing the growth mask between selectively growing the second semiconductor layer of the first conduction type on the first semiconductor layer exposed through the opening in the growth mask and sequentially growing at least the active layer and the semiconductor layer of the second conduction type.

* * * * *